United States Patent [19]
Mizutani et al.

[11] Patent Number: 5,214,489
[45] Date of Patent: May 25, 1993

[54] ALIGNING DEVICE FOR EXPOSURE APPARATUS

[75] Inventors: Hideo Mizutani, Yokohama; Kenji Nishi, Kawasaki, both of Japan

[73] Assignee: Nikon Corporation, Tokyo, Japan

[21] Appl. No.: 687,944

[22] Filed: Apr. 19, 1991

[30] Foreign Application Priority Data

Apr. 25, 1990 [JP] Japan .................................. 2-109293

[51] Int. Cl.$^5$ ............................................. G01B 11/26
[52] U.S. Cl. ...................... 356/363; 356/400; 356/401; 250/566
[58] Field of Search ............... 356/363, 401, 400, 399; 250/567

[56] References Cited

U.S. PATENT DOCUMENTS

| | | | |
|---|---|---|---|
| 4,880,310 | 11/1989 | Nishi | 356/401 |
| 5,004,348 | 4/1991 | Magome | 356/401 |
| 5,025,168 | 6/1991 | Aoki et al. | 356/401 |

Primary Examiner—Samuel A. Turner
Assistant Examiner—La Charles P. Keesee, II
Attorney, Agent, or Firm—Shapiro and Shapiro

[57] ABSTRACT

In an alignment device, irradiation means irradiates two coherent beams, having a predetermined wavelength, to a first diffraction grating formed on a mask and a second diffraction grating formed on a photosensitive substrate via an object optical system in such a manner as to cross with each other at a predetermined angle on one of the first and second diffraction gratings. First light receiving means photoelectrically detects interference light of diffracted rays produced substantially in the same direction from the one diffraction grating. A third diffraction grating is disposed in a plane substantially conjugate to the one diffraction grating, and second light receiving means photoelectrically detects interference light of diffracted rays produced by the third diffraction grating from diffracted rays of the two beams which are diffracted by the other of the first and second diffraction gratings and impinged upon the third diffraction grating at a predetermined incident angle via the object optical system. Detection means compares respective signals from the first and second light receiving means to output a detection signal depending on a shift in relative position between the mask and the photosensitive substrate, and movement means moves the mask and the photosensitive substrate based on the detection signal for changing the relative position therebetween.

12 Claims, 11 Drawing Sheets

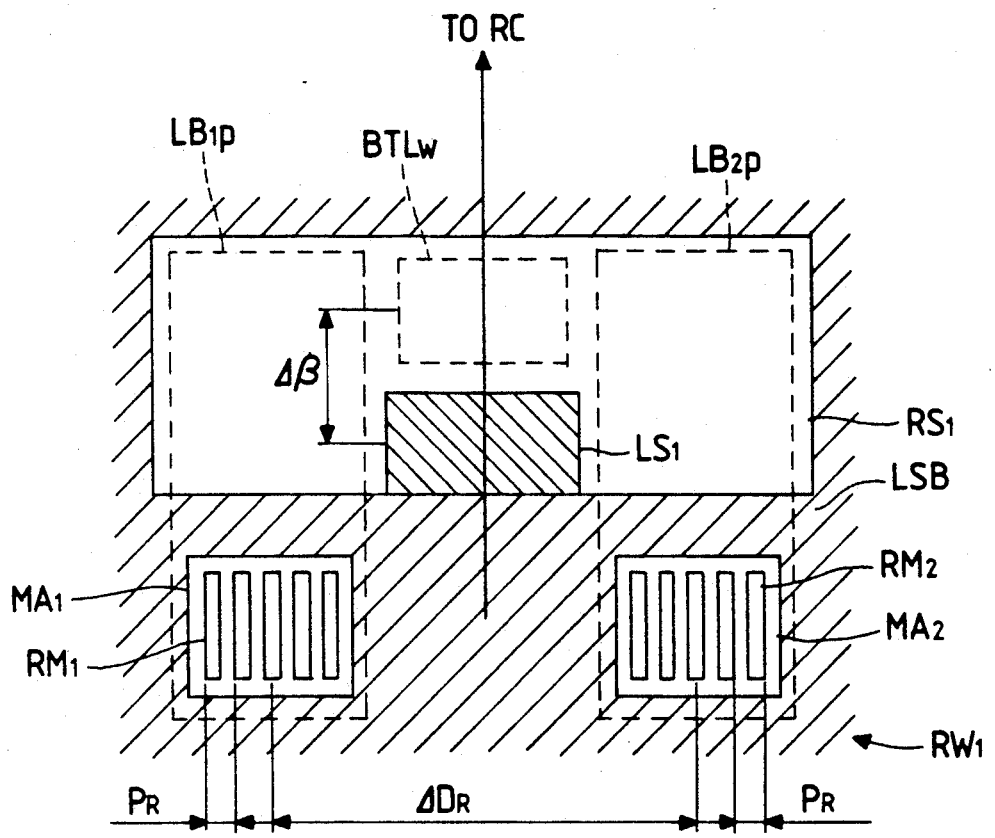

FIG. 12A
PRIOR ART
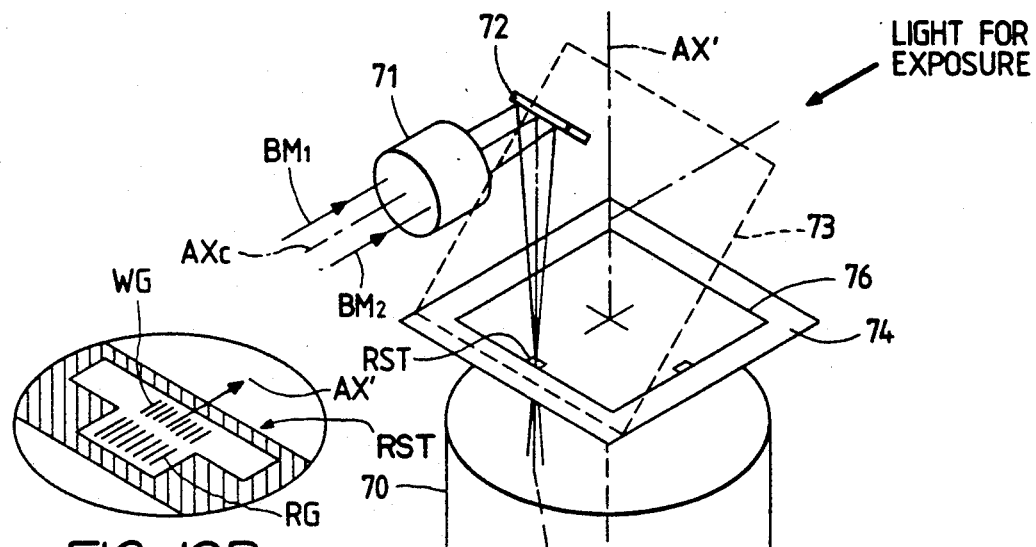
FIG. 12B
PRIOR ART
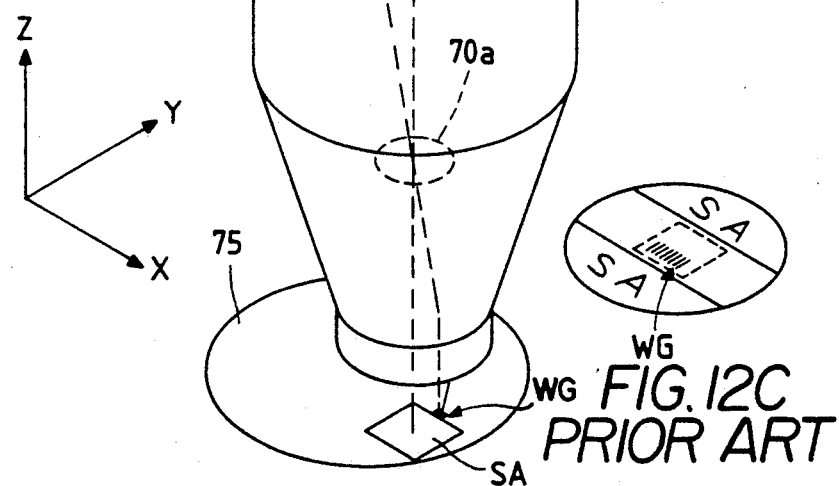
FIG. 12C
PRIOR ART

ALIGNING DEVICE FOR EXPOSURE APPARATUS

BACKGROUND OF THE INVENTION

1. Field of the Invention

The present invention relates to an aligning device between a mask and a photosensitive substrate, which is suitable to a projection type exposure apparatus (stepper or aligner), a proximity type exposure apparatus or the like for transferring onto the photosensitive substrate a pattern of the mask used in the lithography process for production of semiconductor devices or liquid crystal display devices.

2. Related Background Art

Recently, scale-down, projection type exposure apparatus (steppers) using the step and repeat technique have widely been employed in the lithography process as equipment for transferring fine patterns onto photosensitive substrates (semiconductor wafers having photoresist layers formed thereon) with high resolution. In the art of this type steppers, with a higher degree of integration of semiconductor devices, it has been endeavored to shorten the wavelength of light for exposure and develop a projection lens having the increased numerical aperture (N. A.), with the result that a resolvable line width on wafers reaches the order of submicrons (0.5–0.7 $\mu$m) at the present time. Transferring patterns at such a high level of resolution requires a pattern of a reticle (synonymous with a mask) and one shot area on a wafer to be aligned with alignment accuracy (usually about 1/5 of the resolvable line width) corresponding to the resolution achieved. As an alignment system for such steppers, there has conventionally been known a TTR (Through The Reticle) technique designed to, for example, simultaneously detect an alignment mark formed around a circuit pattern on the reticle and an alignment mark formed around the shot area on the wafer.

Such an alignment system utilizing the TTR technique comprises the steps of detecting both an alignment mark on the reticle (i.e., a reticle mark) and an alignment mark on the wafer (i.e., a wafer mark) with high precision, determining a shift or deviation in the relative position between the two marks, and moving the reticle or wafer in a fine manner so as to correct the shift. For purpose of imaging a pattern of the reticle on the wafer with high resolving power, a projection optical system is arranged in the prior-art state to be corrected satisfactorily in chromatic aberration against only illumination light for exposure (e.g., a g line of wavelength 436 nm, i line of wavelength 365 nm, or KrF excimer laser beam of wavelength 248 nm). This means that in the alignment system utilizing the TTR technique to detect both the reticle mark and the wafer mark through the projection optical system, the light used in illuminating the marks is limited to the wavelength which is the same as or very close to that of the light for exposure.

A photoresist layer is formed on the wafer surface in the exposure step, and the wafer mark is detected through the photoresist layer at the time of alignment. The photoresist layer has been designed to have a multilayer photoresist structure or the like which is high in absorptivity and low in transmissivity for the exposure light, in order to permit patterning with higher resolution. This however raises a problem that since the illumination light for alignment is attenuated until reaching the wafer mark and the reflected light (such as the regularly reflected light, the scattered light and the diffracted light) from the wafer mark is also attenuated, the wafer mark cannot be recognized by the alignment system with the sufficient intensity of light, resulting in reduced accuracy of detecting the wafer mark. Further, when the illumination light for alignment is irradiated to the wafer mark to perform alignment, the photoresist layer in that irradiated area is exposed by its very nature and the wafer mark is therefore destroyed while passing through various processes after development. This raises another problem that the mark can no longer be used for alignment in exposure adapted to superpose the next layer.

In view of the above, based on a different-wavelength alignment system (in which illumination light for alignment and light for exposure have different wavelengths) utilizing the TTR technique which has been disclosed in U.S. Pat. No. 4,880,310, for example, there has been proposed a method of optically sensing a one-dimensional diffraction grating mark formed on the wafer or reticle and detecting the position of the wafer or reticle from the resulting pitch information with high resolution (on the order of a fraction to one of several tens fractions of the pitch) in Japanese Patent Laid-Open No. 63-283129 (corresponding to U.S. Ser. No. 192,784 filed on May 10, 1988). A variety of methods have so far been proposed and practiced in detecting the position of the grating mark. Among them, the above method disclosed in Japanese Patent Laid-Open No. 63-283129 is designed to irradiate coherent laser beams (parallel rays) toward the grating mark in two directions simultaneously for forming a one-dimensional interference fringe, and to determine the position of the grating mark from the interference fringe.

The alignment system employing an interference fringe is divided into two categories; i.e., a heterodyne method in which a certain frequency difference is given between two laser beams irradiated in two directions, and a homodyne method which gives no frequency difference. In the homodyne method, a still interference fringe is formed in parallel to a grating mark and the grating mark (or the object) requires to be finely moved in the pitch direction for detecting the position of the grating mark. The grating position is determined on the basis of the interference fringe as a reference. Meanwhile, in the heterodyne method, the frequency difference between the two laser beams (i.e., the beat frequency) causes the interference fringe to flow in the fringe direction (pitch direction) at a high speed. Accordingly, the grating position can be determined not on the basis of the interference fringe, but solely on the basis of a time element (phase difference) incidental to high-speed movement of the interference fringe.

More specifically, by way of example, the heterodyne method determines a phase difference (within $\pm 180°$) between a photoelectric signal (optical beat signal) detected by modulating the intensity of $\pm$1st order diffracted rays from the grating mark with the beat frequency and an optical beat signal of reference interference light separately created from the two transmitted light beams, thereby detecting a position shift within $\pm P/4$ of the grating pitch P. Assuming now that the grating pitch P is 2 $\mu$m (corresponding to a line and a space being each 1 $\mu$m) and measurement of the phase difference has resolution on the order of 0.5°, measurement of the position shift exhibits resolution of $(P/4) \cdot (0.5/180) \approx 0.0014$ μm. Because the mark position detection like this technique provides very high resolution, it is expected that alignment accuracy can be increased one or more orders of level in comparison with the prior-art mark detection.

FIGS. 12A-12C illustrate one example of the schematic configuration of a stepper equipped with an alignment system utilizing the TTR technique. Illumination light for alignment that has a different range of wavelengths from that of light for exposure is converted by a two luminous flux frequency shifter (not shown) into two laser beams $BM_1$, $BM_2$ which have different frequencies and each contain both of linearly polarized lights orthogonal to each other. In FIG. 12, above a reticle 74, there is provided a dichroic mirror 73 acting on the exposure light and the two laser beams $BM_1$, $BM_2$ separately depending on their wavelengths. A pattern of the reticle 74 is illuminated with the exposure light reflected by the dichroic mirror 73 vertically downward, and focused on a wafer 75 by a projection lens 70 having tele-centric surfaces on both sides. The projection lens 70 is corrected in its chromatic aberration for the wavelength (such as g or i line) of the exposure light. The reticle 74 and the wafer 75 are arranged in conjugate relation to each other under the same wavelength. A window (transparent section) RST is defined in a light shielding band surrounding a pattern area 76 of the reticle 74, and a reticle mark RG is formed in about a half of the window RST. On the other hand, a wafer mark WG is formed at the corresponding position in a street line around each shot area SA on the wafer 75.

An object lens 71 comprises a 2-focus element consisted of a plano-convex lens of double-refractive substance (such as quartz or calcite) and a plano-concave lens of glass with their convex and concave surfaces bonded together, and a tele-centric objective, these two components being integrally combined with each other. The object lens 71 gives different power to the beams $BM_1$, $BM_2$ depending on polarized components (one of which parallel to the crystal axis of the 2-focus element is defined as a p-polarized component and the other of which perpendicular thereto is as s-polarized component, by way of example). Accordingly, with one exemplified arrangement, after the beams $BM_1$, $BM_2$ emerging from the object lens 71 are reflected by a mirror 72, p-polarized beams contained in both the beams $BM_1$, $BM_2$ are focused (crossed) on the reticle mark RG, while s-polarized beams contained therein are once crossed in the focal plane (conjugate to the wafer) located in a space above the reticle 74 and again crossed on the wafer mark WG after passing through the window RST and the projection lens 70 (incident pupil 70a). The spacing between the above focal plane and the lower surface (pattern surface) of the reticle 74 corresponds to an amount of on-axis chromatic aberration caused on the reticle side by the projection lens 70 under the wavelengths of the two beams for alignment. Assuming that the exposure wavelength is 248 nm and the alignment wavelength is 633 nm, for example, the resulting amount of on-axis chromatic aberration amounts to about 500 mm, though depending on optical characteristics of the projection lens 70.

Then, ±1st order diffracted rays are produced by each of the reticle mark RG and the wafer mark WG, and their principal rays are returned coaxially with an optical axis AXc of the alignment system and separately received by a photoelectric detector through a spatial filter, a field diaphragm and so forth. The photoelectric detector outputs a photoelectric signal of the interference light on the reticle side and a photoelectric signal of the interference light on the wafer side (both of these photoelectric signals having the beat frequency). A phase difference in the waveform between the two signals is then determined by using as a reference a beat signal of reference interference light separately created from the two transmitted light beams. The reticle 74 and the wafer 75 are moved relatively so that the above phase difference becomes substantially zero, thereby precisely aligning a projected image of the reticle pattern and the shot area SA.

In the above-explained prior art, however, the object lens 71 and the foremost mirror 72 require to be moved together in afocal position and in the plane parallel to the reticle 74 (along the optical axis AXc in the case of FIG. 12) with change in position of the reticle mark depending on the chip size of semiconductor devices, as disclosed in U.S. Pat. No. 4,592,625 by way of example. Therefore, the system becomes so unstable for some reason incidental to movement of the object lens 71 and others that, for example, the optical axis AXc of the alignment system may be inclined in the pitch direction (i.e., the direction of measurement) of the reticle mark RG. Thus, consider now the case where the alignment system is inclined, by referring to FIG. 13. FIG. 13 represents the state in an exaggerated manner where the optical axis AXc is inclined by an angle $\epsilon$ in the pitch direction (X-direction) about a point Wo in the focal plane (conjugate to the wafer) W' above the reticle 74.

As shown in FIG. 13, because the optical axis AXc is just inclined about the point Wo, principal rays $L_{1S}$, $L_{2S}$ of the two s-polarized beams irradiated onto the wafer mark WG will not be shifted in their cross position on the wafer upon the inclination assumed above. Meanwhile, as to principal rays $L_{1P}$, $L_{2P}$ of the two p-polarized beams irradiated onto the reticle mark RG, their cross position will be shifted on the reticle 74 by $\Delta l_1$ in the X-direction upon the inclination. Stated differently, the cross position of the principal rays $L_{1P}$, $L_{2P}$ and the cross position of the principal rays $L_{1S}$, $L_{2S}$ are shifted by $\Delta l_1$ in the pitch direction. Therefore, the accuracy of detecting a relative shift amount between the reticle and the wafer is deteriorated corresponding to the above shift amount $\Delta l_1$, thus raising a problem that the alignment accuracy is also reduced.

Assuming now that the amount of on-axis chromatic aberration caused on the reticle side by the projection lens under the wavelength of the illumination light for alignment is $\Delta L$, the shift amount $\Delta l_1$ is expressed by $\Delta l_1 = \Delta L \cdot \tan\epsilon$. Accordingly, given the amount of on-axis chromatic aberration being 500 mm and an allowable value (maximum value) of the shift amount $\Delta l_1$ on the reticle from the standpoint of alignment accuracy being 0.05μ, an allowable angle error (allowable inclination amount) in the alignment system is as very small as $\epsilon = 0.02''$ from the above equation ($\tan\epsilon = \Delta l_1/\Delta L$). This implies that the inclination amount of the overall alignment system must be held within 0.02''. But, taking into account instability of the movable alignment system, an inclination on the order of 1-2'' will be produced by its very nature in the overall system even if vibrations and thermal fluctuations are minimized. Therefore, the cross position of the principal rays $L_{1P}$, $L_{2P}$ will be shifted at least 2.5 μm on the reticle and thus about 0.5 μm (in the case of the projection lens with a projecting magnification of 1/5) on the wafer. As a result, even a high-resolution alignment system which has practical measurement resolution as high as 0.01 μm in consideration of an effect of noise and so forth becomes ineffective in practical use. It is to be noted that other than vibration of the alignment system, drifts of the beams $BM_1$, $BM_2$ caused by fluctuations in position of a pair of oscillation mirrors disposed in a laser light source, for example, may also reduce the alignment accuracy.

Furthermore, when the object lens 71 (only the telecentric objective) is offset from the optical axis AXc (or AX') of the alignment system, for example, the cross position of the principal rays $L_{1S}$, $L_{2S}$ on the wafer (or a conjugate surface W') and the cross position of the principal rays $L_{1P}$, $L_{2P}$ on the reticle are also shifted by $\Delta l_2$ in the X-direction (pitch direction). This shift amount $\Delta l_2$ directly leads to an alignment error in a like manner. Consequently, the alignment system using illumination light having a different range of wavelengths from exposure light has suffered from the problem that if an alignment beam is inclined with respect to the direction of measurement of alignment marks (i.e., in the pitch direction) due to such as inclination of its optical system or offset of optical components, the alignment accuracy is remarkably reduced by the presence of the on-axis chromatic aberration $\Delta L$.

SUMMARY OF THE INVENTION

The present invention has been made in view of the foregoing, and has for its object to provide an aligning device suitable for an exposure apparatus which can prevent a reduction in alignment accuracy due to instability (such as inclination or offset of optical components) of an alignment system.

To achieve the above object, the present invention provides an alignment device provided in an apparatus, which uses illumination light IL in a predetermined range of wavelengths to project and focus an image of a pattern formed on a reticle R onto a wafer W through a projection lens PL, for optically detecting a first diffraction grating [reticle mark RM] formed on the reticle R and a second diffraction grating [wafer mark WM] formed on the wafer W to thereby align the reticle R and the wafer W with each other, the aligning device comprising:

irradiation means [laser beam source 10, two luminous flux frequency shifter 11, a field diaphragm 15, etc.] for irradiating two coherent beams [$LB_{1P}$, $LB_{2P}$], having a different range of wavelengths from the illumination light IL, to the first and second diffraction gratings via an object optical system [object lens 22] in such a manner as to cross with each other at a cross angle $2\theta w$ on one of the first and second diffraction gratings;

first light receiving means [first measurement signal generator 20] for photoelectrically detecting interference light $BTL_W$ of diffracted rays produced substantially in the same direction from one diffraction grating [wafer mark WM] onto which the two beams [$LB_{1P}$, $LB_{2P}$] are irradiated in a crossing manner;

a third diffraction grating [reference grating plate 48] disposed in a plane substantially conjugate to one diffraction grating [wafer mark WM];

second light receiving means [second measurement signal generator 18] for photoelectrically detecting interference light $BTL_W$ of diffracted rays produced by the third diffraction grating from diffracted rays [$RL_1$, $RL_2$] of the two beams [$LB_{1P}$, $LB_{2P}$] which are diffracted by the other [reticle mark RM] of the first and second diffraction gratings and impinged upon the third diffraction grating at a predetermined incident angle via the object optical system;

detection means [phase detection system 27] for comparing respective signals from the first and second light receiving means to output a detection signal depending on a shift in relative position between the reticle R and the wafer W; and movement means [reticle stage RS or wafer stage WS] for changing the relative position between the reticle R and the wafer W based on the detection signal.

In the present invention, two coherent beams are entered to (focused on) either one of a first diffraction grating formed on a mask and a second diffraction grating formed on a photosensitive substrate via an object optical system at a predetermined cross angle, and a third diffraction grating is located in or near a plane substantially conjugate to one diffraction grating. There are further provided first light receiving means for photoelectrically detecting interference light of diffracted rays produced substantially in the same direction from one diffraction grating onto which the two beams are irradiated in a crossing manner, and second light receiving means for photoelectrically detecting interference light resulted from irradiating diffracted rays of the two beams by the other diffraction grating onto the third diffraction grating via the object optical system, and interfering diffracted rays produced by the third diffraction grating with each other. Respective signals from the first and second light receiving means are then compared to obtain a detection signal depending on a relative displacement between the mask and the photosensitive substrate. Therefore, it is possible to prevent a reduction in alignment accuracy due to instability (such as inclination or offset of optical components) of an alignment system.

Principles of the present invention will now be described with reference to FIG. 11. FIG. 11 represents the state where two beams emerging from a tele-centric object optical system (not shown) of the alignment system are once crossed to each other at a point A in the focal plane (plane substantially conjugate to a photosensitive substrate) W' of the object optical system on the downstream side and then impinged on a reticle Rm. Here, principal rays LL', LR' as given when the two beams (plane waves) are inclined by an angle $\epsilon$ about the point A are indicated by solid lines, and principal rays LL, LR as given when the two beam are not inclined are indicated by broken lines. The principal rays LL', LR' of the two beams are incident upon points P', Q' on the reticle Rm, respectively, and 1st order diffracted rays $LL_1$, $LR_2$ of their reflected lights are crossed with each other at a point B in the focal plane W'.

For the principal ray LL' of the two beams (principal rays LL', LR') entering the reticle RM through the point A on the left side as viewed in the drawing sheet, an optical path length $S_L$ of the wave front thereof from diffraction at a point P (grating mark) on the reticle Rm until returning to the point A again is expressed by:

$$S_L = AT + UM \quad (1)$$

On the other hand, for the principal ray LR' on the right side, an optical path length $S_R$ of the wave front thereof from diffraction at a point Q (grating mark) until returning to the point A again is expressed by:

$$S_R = AR + SL' \quad (2)$$

When the beam enters the grating mark with an inclination of the angle $\epsilon$, the diffracted ray from the mark is also produced in the direction inclined by the angle $\epsilon$. Therefore:

$\Delta APT \equiv \Delta AQR \quad \therefore AT = AR$
$\Delta APM \equiv \Delta AQL \quad \therefore PM = QL$
$QL = SL', PM = UM'$ From the above, the following equation is derived:

$$AR + SL' = AT + UM' \quad (3)$$

Thus, from (1) to (3), there holds:

$$S_L = S_R \quad (4)$$

Accordingly, since the optical path lengths $S_L$ of the two beams (principal rays $LL_1$, $LR_1$) from diffraction by the reticle mark (first diffraction grating) formed on the reticle Rm until crossing with each other in the focal plane W' again become constant independently of any inclination, the position of an interfence fringe produced by the diffracted rays in the focal plane W' will not be shifted (in the focal plane W') and remain immobile.

In view of the foregoing, the present invention includes a third diffraction grating located in or near a plane substantially conjugate to the focal plane W', so that the interference fringe will not be shifted on the third diffraction grating in the direction of measurement (i.e., in the pitch direction) even if the alignment system is inclined as stated before. Meanwhile, because the focal plane W' is also substantially conjugate to a wafer mark (second diffraction grating) formed on the photosensitive substrate, another interference fringe similarly produced by two beams will not be shifted on the wafer mark in the direction of measurement. As a result, even if the alignment system is inclined in the focal plane W' about the point A, i.e., even if the two beams are inclined, the alignment accuracy between the mask and the photosensitive substrate will not be reduced.

While only an inclination of the alignment system about the point A has been taken into consideration, a translational movement of part of the optical system in the pitch direction will not lead to an alignment error so long as the shift amount in relative position between the mask and the photosensitive substrate, for the two beams entering each of the reticle mark and the wafer mark are just shifted in the same amount thereon. Accordingly, even when the alignment system is inclined about a point other than the point A, this inclination can be eventually resulted in a combination of an inclination about the point A and a translational movement. In other words, with the arrangement of the present invention, a rotation about an arbitrary point and a translational movement will not lead to any alignment error. It is thus understand that taking into account only an inclination about the point A is sufficient for explanation of the principles.

BRIEF DESCRIPTION OF THE DRAWINGS

FIG. 3 is a view showing the detailed configuration of a transparent window for alignment;

FIGS. 12A–12C depict, schematically, the configuration of a stepper equipped with a conventional TTR-type alignment system.

DETAILED DESCRIPTION OF THE PREFERRED EMBODIMENTS

Figure 1:
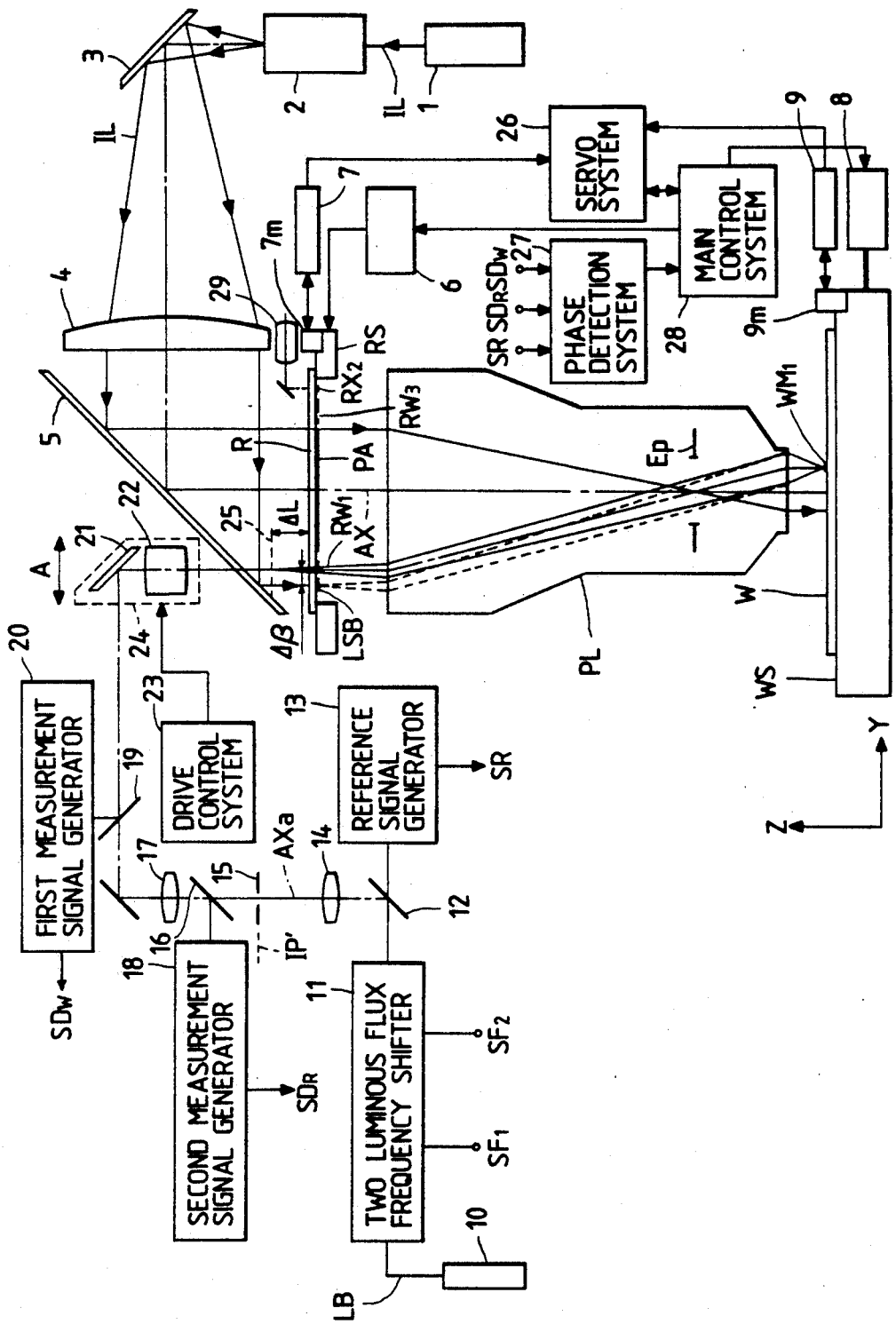
FIG. 1 is a view showing the schematic configuration of a stepper equipped with a TTR-type alignment system according to a first embodiment of the present invention.

FIG. 1 is a view showing the schematic configuration of a stepper equipped with a TTR-type alignment system according to a first embodiment of the present invention. The alignment system is designed to be movable in conformity with change in the position of a reticle mark depending on the chip size of semiconductor devices.

In FIG. 1, an illumination light source 1 such as a ultra-high-pressure mercury lamp or excimer laser unit emits illumination light IL for exposure, such as a g line, i line or KrF excimer laser beam, in a range of wavelengths able to make a photoresist layer sensitized. The exposure light IL enters an illumination optical system 2 including an optical integrator (fly's-eye lens). The exposure light IL is subjected to an increase in evenness of beam density, a reduction of speckles, etc. in the illumination optical system 2, and then reaches a dichroic mirror 5 via a mirror 3 and a main condenser lens 4. The dichroic mirror 5 reflects the exposure light IL from the main condenser lens 4 vertically downward to irradiate a reticle R with uniform illuminance. The dichroic mirror 5 is obliquely disposed above the reticle R at an angle of 45°, and has reflectivity over 90% for the wavelength of the exposure light IL and transmissivity over 50% for the wavelength of illumination light (usually longer than that of the exposure light) for alignment.

The reticle R is formed with transparent windows $RW_1$, $RW_3$ for alignment in a light shielding band (chromium layer) LSB of constant width which surrounds a pattern area PA, and also reticle alignment marks $RX_1$, $RX_2$ (only $RX_2$ being shown) outwardly of the windows (on the outer side nearer to peripheral edges of the reticle) for positioning of the reticle R. The reticle R is placed on a reticle stage RS and positioned so that the center of the pattern area PA coincides with an optical axis AX. The reticle stage RS is two-dimensionally movable by a drive motor 6 in a horizontal plane, and has a movable mirror $7m$ fixed to its end for reflecting a laser beam from a laser beam interference type length gauge (hereinafter referred to as an interferometer) 7. The interferometer 7 always detects a two-dimensional position of the reticle R with resolution on the order of 0.01 μm, for example. The reticle R is initialized by finely moving the reticle stage RS based on a mark detection signal from a reticle alignment system 29 which photoelectrically detects the alignment mark $RX_2$ in the peripheral portion of the reticle.

The exposure light IL having passed through the pattern area PA is incident upon a projection lens PL having tele-centric surfaces on both sides, and the projection lens PL projects (focuses) an image of circuit pattern of the reticle R onto one shot area on a wafer W in superposed relation, on the surface of which a photoresist layer is formed. On the wafer W, a wafer mark $WM_1$ (second diffraction grating) is formed in a certain position relation with respect to the shot area in the vicinity thereof. The projection lens PL is corrected in its chromatic aberration satisfactorily against the wavelength (such as a g line, i line or KrF excimer laser) of the exposure light IL. The reticle R and the wafer W are arranged in conjugate relation to each other under the wavelength of the exposure light. Further, the wafer W is placed on a wafer stage WS two-dimensionally movable by a drive motor 8 using the step and repeat technique. Each time transfer exposure of the reticle R is completed for one shot area on the wafer W, the wafer stage WS is stepped up to a next shot position. A two-dimensional position of the wafer stage WS is detected by an interferometer 9 with resolution on the order of 0.01 μm, for example, and a movable mirror $9m$ is fixed to an end of the wafer stage WS for reflecting a laser beam from the interferometer 9.

Figure 2:
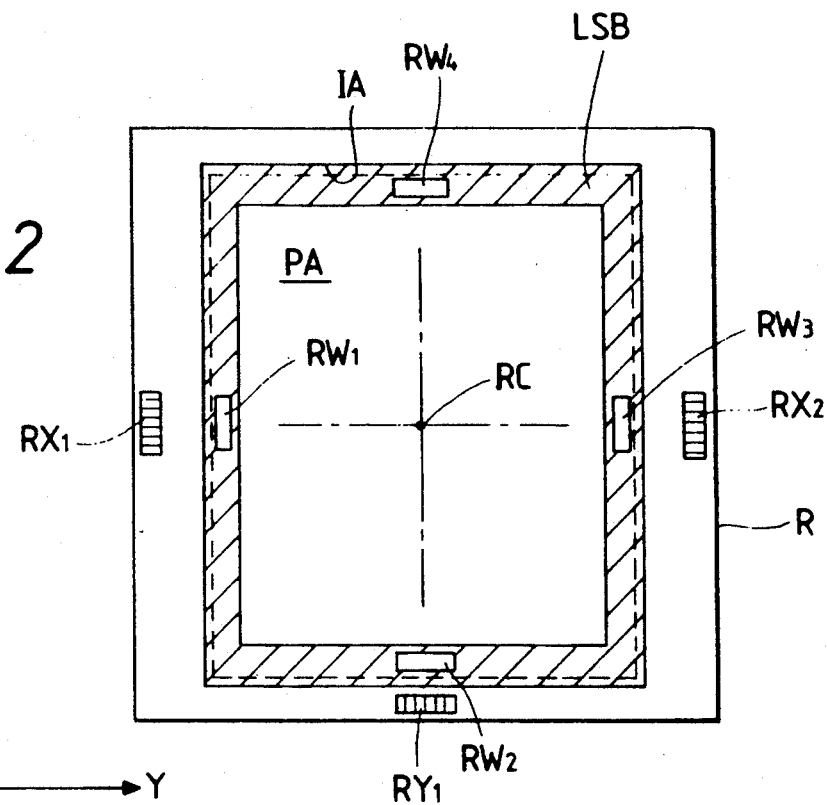
FIG. 2 is a view showing one example of a pattern shape and arrangement of a reticle for use in superposing exposure of second and subsequent layers.

FIG. 2 shows one example of a pattern shape and arrangement of the reticle R for use in superposing exposure of second and subsequent layers. Transparent windows $RW_1$-$RW_4$ are formed adjacent the pattern area PA in the light shielding band LSB which surrounds the pattern area PA, and reticle alignment marks $RX_1$, $RX_2$, $RY_1$ are formed outwardly of the light shielding band LSB. The reticle alignment marks $RX_1$, $RX_2$, $RY_1$ are arranged such that they are always held at fixed positions even with the size of the pattern area PA changed, and also positioned outwardly of an irradiated area IA of the exposure light IL. On the other hand, the transparent windows $RW_1$, $RW_3$ are disposed in opposite relation on a line passing through the reticle center RC and parallel to the Y-axis, while the transparent windows $RW_2$, $RW_4$ are disposed in opposite relation on a line passing through the reticle center RC and parallel to the X-axis. In addition, the width of the light shielding band LSB is set to a value larger than 1/M time (M denoting a projecting magnification of the projection lens PL) the width of a street line on the wafer, and the size of the irradiated area IA is set to cover a region including the pattern area PA and the transparent windows $RW_1$-$RW_4$, i.e., a region including one shot area and street lines around four sides of the shot area on the wafer.

FIG. 3 shows one example of the detailed configuration of the transparent window $RW_1$ in the reticle R. The transparent window $RW_1$ comprises a rectangular transparent section $RS_1$ and mark areas $MA_1$, $MA_2$. The transparent section $RS_1$ allows not only beams $LB_{1P}$, $LB_{2P}$ for alignment but also diffracted rays of predetermined order (interference light $BTL_W$) of the beams $LB_{1P}$, $LB_{2P}$ from the water mark $WM_1$ to pass therethrough (described later in more detail). The mark areas $MA_1$, $MA_2$ are provided to space from each other by a spacing $\Delta D_R$. In the mark areas, reticle marks $RM_1$, $RM_2$ in the form of a diffraction grating (having a duty ratio of 1:1 and jointly constituting the first diffraction grating) are respectively formed with a pitch $P_R$.

A light shielding section $LS_1$ (chromium layer) is formed in the transparent section $RS_1$ to protect the wafer mark $WM_1$ during exposure. More specifically, this protection can be ensured by using, as the illumination light for alignment, a monochromatic laser beam having a range of wavelengths different from that of the exposure light IL, e.g., the wavelength over 530 nm at which the photoresist layer hardly exhibits a photosensitive sensitivity, so that the light shielding section $LS_1$ and the wafer mark $WM_1$ come into focusing relation (as indicated by dotted lines) under the wavelength of the exposure light IL when a projection image of the pattern area PA is precisely superposed onto the shot area on the wafer W, and also by setting an amount $\Delta\beta$ of magnification chromatic aberration (here in terms of amount on the reticle R) to a proper value larger than a certain one depending on the sizes of the transparent section $RS_1$ and the wafer mark $WM_1$, etc. By so doing, a projection image of the transparent section $RS_1$ is focused at a position shifted by a value ($\Delta\beta\cdot M$) corresponding to the amount of magnification chromatic aberration from the wafer mark $WM_1$ toward the shot area under the wavelength of the exposure light IL.

Figure 4:
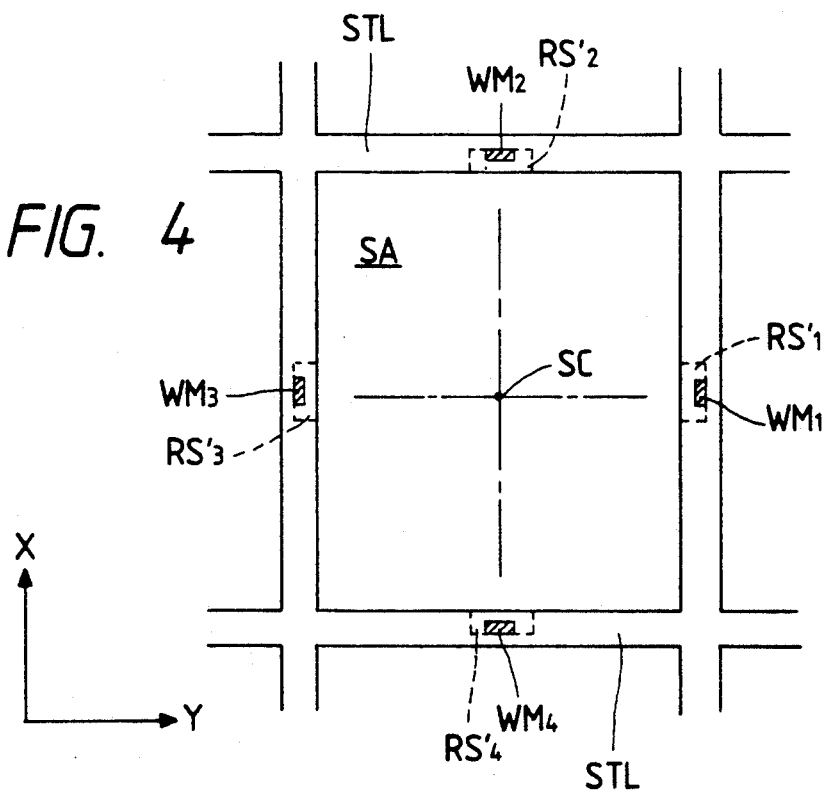
FIG. 4 is a view showing one of plural shot areas (in the first layer) formed on a photosensitive substrate in advance.

FIG. 4 shows one SA of plural shot areas (e.g., in the first layer) formed on the wafer. Around four sides of one shot area SA, street lines STL are formed with a width being usually on the order of 50-100 μm. The street line STL serves as a cutting margin when chips on the wafer are cut away separately, so part of the circuit pattern will be never extended to be formed in a region of the street lines. Accordingly, at the time of forming the shot area SA in the first layer, there are also formed wafer marks $WM_1$, $WM_3$ in opposite relation on a line passing through the shot center SC and parallel to the Y-axis, and wafer marks $WM_2$, $WM_4$ in opposite relation on a line passing through the shot center SC and parallel to the X-axis. The wafer marks $WM_1$, $WM_3$ are used for position detection in the X-direction, whereas the wafer marks $WM_2$, $WM_4$ are used for position detection in the Y-direction. In this connection, the wafer marks $WM_1$-$WM_4$ are arranged so that projection images $RS_1'$-$RS_4'$ of the transparent sections $RS_1$-$RS_4$ (only $RS_1$ being shown in this embodiment) locate between the shot area SA and the wafer marks $WM_1$-$WM_4$, respectively.

While FIG. 1 shows only the alignment system for detecting the wafer mark $WM_1$ and the transparent window $RW_1$, there are practically disposed four sets of alignment systems corresponding to the wafer marks $WM_1$-$WM_4$, and three sets of reticle alignment systems corresponding to the reticle alignment marks $RX_1$, $RX_2$, $RY_1$. Incidentally, by moving part (mirror 21, object lens 22) of the alignment system horizontally in FIG. 1, the reticle alignment mark ($RX_1$ shown in FIG. 2) can be easily detected. But the reticle R requires to be precisely aligned with the apparatus and, therefore, the reticle alignment systems for specific purpose are fixedly provided in this embodiment.

Figure 5:
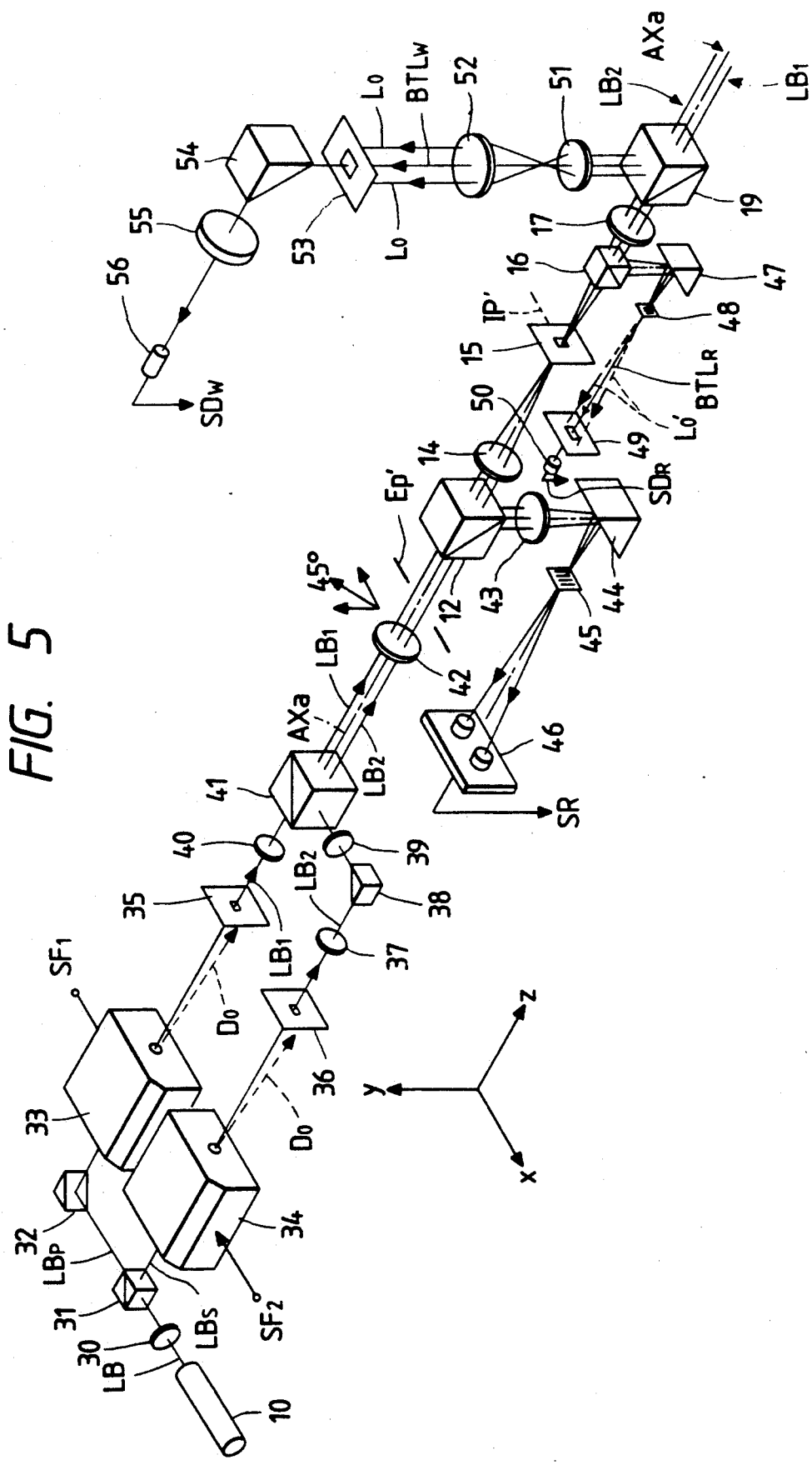
FIG. 5 is a perspective view showing the detailed configuration of the alignment system in FIG. 1.
Figure 6:
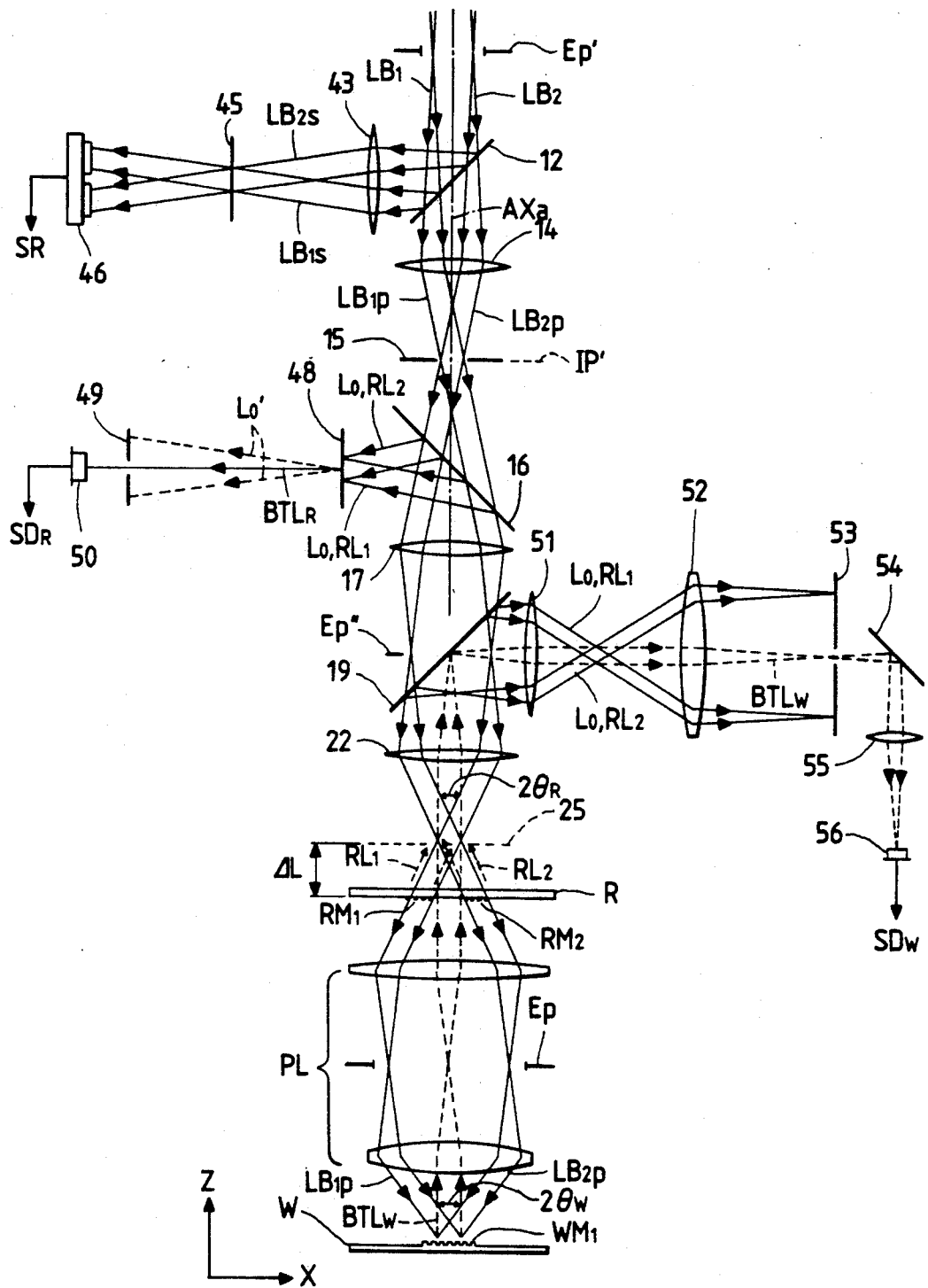
FIG. 6 is a view showing, in more detail, primary part of the alignment system according to the first embodiment.

Next, the TTR type alignment system of this embodiment will be explained in detail by referring to FIGS. 5 and 6. FIG. 5 is a perspective view showing the detailed configuration of the alignment system, and FIG. 6 shows primary part of the alignment system in more detail. In FIG. 6, the dichroic mirror 5 and the mirror 21 of FIG. 1 and mirrors 44, 47 of FIG. 5 are omitted.

As shown in FIG. 5, a laser beam source 10 generates linearly polarized illumination light LB for alignment. The illumination light LB passes through a ½ wavelength plate 30 to be rotated in the axis of polarization by about 45° with respect to the incident plane, followed by entering a polarized beam splitter 31 where the illumination light LB is divided into a p-polarized beam $LB_p$ and a p-polarized beam $LB_S$ both having almost the same intensity of light. The illumination light LB is a laser beam in a range of wavelengths different from that of the exposure light IL, for example, such as emitted by a He-Ne laser with the wavelength of 633 nm at which the photoresist layer hardly exhibits a photosensitive sensitivity.

The p-polarized beam $LB_p$ having passed through the polarized beam splitter (PBS) 31 enters via a mirror 32 a first acoustic optical modulator 33 (hereinafter referred to simply as an AOM 33), while the s-polarized beam $LB_S$ reflected by the PBS 31 enters a second acoustic optical modulator 34 (hereinafter referred to simply as an AOM 34). The AOM 33 is driven by a high-frequency signal $SF_1$ of frequency $f_1$ to output the 1st order diffracted ray, as a beam $LB_1$, which is deflected through a diffraction angle determined by the frequency $f_1$. The AOM 34 is likewise driven by a high-frequency signal $SF_2$ of frequency $f_2$ ($f_2 = f_1 - \Delta f$) to output the 1st order diffracted ray, as a beam $LB_2$, so that a frequency difference between the beam $LB_1$ of frequency $f_1$ and the beam $LB_2$ of frequency $f_2$ becomes $\Delta f$, the beam $LB_2$ being deflected through a diffraction angle determined by the frequency $f_2$.

In this connection, other emergent beams Do than the +1 order diffracted rays of the beams emerging from the AOM's 33, 34 are shielded by slits 35, 36 disposed at appropriate positions, respectively. The relationship between the drive frequencies $f_1$, $f_2$ and the frequency difference $\Delta f$ is preferably to meet $f_1 >> \Delta f$ and $f_2 >> \Delta f$. An upper limit of $\Delta f$ is determined properly based on responsivity of photoelectric detectors 46, 50, 56. In this embodiment, the drive frequencies $f_1$, $f_2$ of the AOMs 33, 34 are set to 80.000 MHz, 79,975 MHz, for example, and the diffraction angles of the 1st order diffracted rays in the two AOM's 33, 34 are equal to each other for setting the frequency difference $\Delta f$ to as low as 25 KHz. Note that light guide paths may be used as frequency shifters for the beams $LB_p$, $LB_s$ in place of the AOM's.

The p-polarized beam $LB_1$ emerging from the AOM 33 after being modulated at the frequency $f_1$ enters via a lens 40 a half beam splitter (HBS) 41 disposed in a pupil plane or thereabout of the alignment system, while the s-polarized beam $LB_2$ emerging from the AOM 34 after being modulated at the frequency $f_2$ is converted into a p-polarized beam under the action of a ½ wavelength plate 37, followed by entering the HBS 41 via a mirror 38 and a lens 39. Though not shown, the HBS 41 has a total reflection mirror vapor-deposited on a half of the joining surface thereof. The beam $LB_2$ led to enter the total reflection mirror is reflected with the intensity of light being about 100%, and the beam $LB_1$ passes through a transparent section of the joining surface of the HBS 41 at it is. Here, the HBS 41 functions not to synthesize the two beams $LB_1$, $LB_2$ in a completely coaxial state, but to synthesize them in a parallel state with a certain interval or spacing kept therebetween. With that arrangement, principal rays of the two p-polarized beams $LB_1$, $LB_2$ are positioned to be not only parallel to each other, but also symmetrical about an optical axis AXa of the alignment system. Incidentally, those components from the ½ wavelength plate 30 to the HBS 41 in the order of reference numerals jointly constitute the two luminous flux frequency shifter 11 in FIG. 1.

The two p-polarized beams $LB_1$ (frequency $f_1$) and $LB_2$ (frequency $f_2$) emerging from the HBS 41 with their principal rays being parallel to each other are both rotated in the direction of polarization by 45° under the action of a ½ wavelength plate 42, and once condensed to spots (FIG. 6) in a pupil plane Ep' (located at a beam waist position and substantially conjugate to an entrance pupil Ep) or thereabout of the alignment system under the action of the lenses 40, 39, followed by entering a polarized beam splitter (PBS) 12. The PBS 12 divides the beam $LB_1$ into a p-polarized beam $LB_{1P}$ and an s-polarized beam $LB_{1S}$ of frequency $f_1$, and the beam $LB_2$ into a p-polarized beam $LB_{2P}$ and an s-polarized beam $LB_{2S}$ of frequency $f_2$.

As also shown in FIG. 6, the two s-polarized beams $LB_{1S}$ (frequency $f_1$) and $LB_{2S}$ (frequency $f_2$) reflected by the PBS 12 enter a reference signal generator 13 (FIG. 1) comprising a lens system for converting the pupil into the image surface (reverse Fourier transforming lens) 43, a mirror 44, a reference diffraction grating 45 disposed in the focal plane of the lens system 43 on the downstream side, and a photoelectric detector 46. The two beams $LB_{1S}$, $LB_{2S}$ are reflected by the mirror 44 after passing through the lens system 43, so that they enter the reference diffraction grating 45 fixed on the apparatus in parallel beams from two different directions to be focused (crossed) thereon at a predetermined cross angle. The photoelectric detector 46 has two sets of light receiving elements (or a 2-divided light receiving element) to independently receive (or photoelectrically convert) interference light of a 0th order ray of the beam $LB_{1S}$ passing through the reference diffraction grating 45 and a +1st order diffracted ray of the beam $LB_{2S}$ propagating coaxially with the 0th order ray and interference light of a −1st order diffracted ray of the beam $LB_{1S}$ and a 0th order ray of the beam $LB_{2S}$ propagating coaxially with the −1st order diffracted ray. Photoelectric signals in the sinusoidal form with amplitudes depending on the intensity of those two interference lights are added to each other by an amplifier (not shown), and a resulting photoelectric signal SR becomes a light beat signal having frequency proportional to the frequency difference $\Delta f$ between the beams $LB_{1S}$ and $LB_{2S}$. In this connection, the grating pitch of the reference diffraction grating 45 is set to be equal to the pitch of an interference fringe produced by the beams $LB_{1S}$, $LB_{2S}$. Note that the photoelectric detector 46 may be designed to receive the above two interference lights on the same light receiving surface and output a photoelectric signal depending on the intensity of the interference lights added to each other on that light receiving surface. This arrangement has an advantage that the spacing between the reference diffraction grating 45 and the photoelectric detector 46 can be shortened.

On the other hand, the two p-polarized beams $LB_{1P}$ (frequency $f_1$) and $LB_{2P}$ (frequency $f_2$) having passed through the PBS 12 are converted by a lens 14 into parallel beams inclined by a predetermined angle relative to each other, and once crossed at a field diaphragm 15 disposed in the focal plane (plane substantially conjugate to the wafer) of the lens 14 on the downstream side, followed by exiting from a lens 17 after passing through a beam splitter (NBS) 16. At this point, as shown in FIG. 6, the beams $LB_{1P}$, $LB_{2P}$ become focusing beams which have their principal rays each substantially parallel to the optical axis AXa of the alignment system and are condensed to two spots in a pupil plate Ep'' (beam waist position) substantially in point symmetrical relation with respect to the optical axis AXa. Then, the beams $LB_{1P}$, $LB_{2P}$ vertically impinge on the dichroic mirror 5 via a beam splitter (NBS) 19, a mirror 21 and a tele-centric object lens 22 so that they are once crossed in a focal plane 25 of the object lens 22 at a cross angle $2\theta_R$ (uniquely determined by a later-described cross angle $2\theta_W$ on the wafer) and, thereafter, separated in the pattern surface of the reticle R to irradiate the transparent window $RW_1$, i.e., the reticle marks $RM_1$, $RM_2$, respectively. The focal plane 25 (of the object lens 22 on the downstream side) is substantially conjugate to the wafer surface under the wavelength of the illumination light LB for alignment, and the spacing between the focal plane 25 and the pattern surface of the reticle R corresponds to an amount $\Delta L$ of on-axis chromatic aberration of the projection lens PL. Accordingly, the spacing $\Delta D_R$ (FIG. 3) between the reticle marks $RM_1$ and $RM_2$ is determined as $\Delta R_R = 2 \cdot \Delta L \cdot \tan\theta_R$.

The beams $LB_{1P}$, $LB_{2P}$ irradiate the reticle marks $RM_1$, $RM_2$ (FIG. 3), respectively, and also in their parts enter the projection lens PL after passing through the transparent section $RS_1$ to be once condensed to spots in the entrance pupil Ep substantially in point symmetrical relation with respect to the pupil center (optical axis AXa). Then, the beams $LB_{1P}$, $LB_{2P}$ become parallel beams inclined at symmetrical angles about the optical axis AX in the pitch direction of the wafer mark $WM_1$ so that they enter the wafer mark $WM_1$ from two different directions to be focused (crossed) thereon at a predetermined cross angle $2\theta_W$. Note that the cross angle $2\theta_W$ of the beams $LB_{1P}$, $LB_{2P}$ will not exceed even at maximum the numerical value (N.A.) of the projection lens PL on the emergent (wafer) side. Further, the field diaphragm 15 disposed in the wafer conjugate plane IP' serves to optionally set a shape of the illumination light (irradiated area) on the wafer. While a rectangular opening is formed in the field diaphragm 15 in this embodiment, it is desirable in practice to form the opening in a rhombic, parallelogrammic or like shape, for example, which has edges inclined with respect to the interference fringe produced by the beams $LB_{1P}$, $LB_{2P}$. Also, the direction of a straight line connecting two spots of the beams $LB_{1P}$, $LB_{2P}$ formed at the entrance pupil substantially in point symmetrical relation with respect to the optical axis AXa is almost coincident with the pitch direction of the wafer mark $WM_1$.

When the beams $LB_{1P}$, $LB_{2P}$ enter the wafer mark $WM_1$ at the cross angle $2\theta_W$, a one-dimensional fringe is produced in a space area where the beams $LB_{1P}$, $LB_{2P}$ are crossing with each other and in an arbitrary plane normal to the optical axis AX (i.e., in the wafer surface) at a pitch $P_f$ equal to 1/N time (N: natural number) of the pitch $P_W$ of the wafer mark $WM_1$ (given $P_f = P_W/2$ in this embodiment). Such an interference fringe moves (flows) in the pitch direction (X-direction) of the wafer mark $WM_1$ at a speed depending on the frequency difference $\Delta f$ between the beams $LB_{1P}$ and $LB_{2P}$. The speed V is expressed by a equation of $V = \Delta f \cdot P_f$. Assuming that the wavelength of the illumination light LB for alignment is $\lambda_W$, the cross angle $2\theta_W$ is determined so as to meet the equation (5) below:

$$\sin\theta_W = \frac{\lambda}{P_W} \quad (5)$$

As a result, the wafer mark $WM_1$ produces $\pm 1$st order diffracted rays which give beat wave fronts periodically repeating changes of light and dark stripes upon movement of the interference fringe. These diffracted rays are synthesized in coaxial relation and propagated reversely along the optical axis AX to pass through the center of the entrance pupil Ep. Because of the same polarized component (p-polarized component), the two diffracted rays interfere with each other to become a light beat (interference light) $BTL_W$ which is returned up to the NBS 19 via the projection lens PL, the transparent window $RW_1$ of the reticle R, the dichroic mirror 5, the object lens 22 and the mirror 21. At the NBS 19, the light beat $BTL_W$ is reflected thereby to enter a first measurement signal generator 20 (FIG. 1) comprising an afocal magnifying relay system 51, 52, a spatial filter 53, a mirror 54, a condenser lens 55 and a photoelectric detector 56.

In the first measurement signal generator 20, the interference light $BTL_W$ from the wafer mark $WM_{1P}$ passes through the afocal magnifying relay system 51, 52 and reaches the spatial filter 53 arranged substantially in conjugate relation to the entrance pupil Ep. Of the reflected lights returning exactly coaxially with the principal rays of the beams $LB_{1P}$, $LB_{2P}$, a 0th order ray $L_0$ and 1st order diffracted rays $RL_1$, $RL_2$ (described later in detail) from the reticle marks $RM_1$, $RM_2$ are cut off to extract only the interference light $BTL_W$. Then, the interference light $BTL_W$ is received by the photoelectric detector 56 via the mirror 54 and the condenser lens 55. The photoelectric detector 56 produces a photoelectric signal corresponding to the interference light $BTL_W$, which is outputted to a phase detection system 27 in the form of a sinusoidal alternating current signal depending on the period of light and dark stripes changing in the interference fringe, i.e., a light beat signal $SD_W$ having beat frequency of the frequency difference $\Delta f$. In the case of arranging the photoelectric detector 56 immediately behind the spatial filter 53, the condenser lens 55 can be dispensed with as a matter of course.

In addition to the $\pm 1$st order diffracted rays (interference light) $BTL_W$, interference light between the 0th order ray of the beam $LB_{1P}$ and +2th order diffracted ray of the beam $LB_{2P}$ both returning exactly coaxially with the principal rays of the beams $LB_{1P}$, $LB_{2P}$, and interference light between $-2$th order diffracted ray of the beam $LB_{1P}$ and the 0th order ray of the beam $LB_{2P}$ both also returning exactly coaxially with the principal rays of the beams $LB_{1P}$, $LB_{2P}$ may be independently received by photoelectric detectors in a plane substantially conjugate to the entrance pupil Ep (i.e., surface of the spatial filter 53) in the first measurement signal generator 20. In this case, photoelectric signals in the sinusoidal form with amplitudes depending on the intensity of those two interference lights are added to each other by an amplifier (not shown), and a resulting photoelectric signal (light beat signal) is outputted to the phase detection system 27. That light beat signal may be used in place of the aforementioned light beat signal $SD_W$ of the interference light $BTL_W$. Alternatively, that light beat signal and the light beat signal $SD_W$ may be selectively used depending on amplitudes of the signals, for example. In this connection, it is required to arrange a field diaphragm in the afocal magnifying relay system 51, 52 at a position substantially conjugate to the wafer W, thereby cutting off the 1st diffracted rays $RL_1$, $RL_2$ from the reticle marks $RM_1$, $RM_2$ to extract only the above two interference lights.

Meanwhile, the pitch $P_R$ (FIG. 3) of the reticle marks $RM_1$, $RM_2$ to which the beams $LB_{1P}$, $LB_{2P}$ are irradiated is determined below depending on the cross angle $2\theta_R$ of the beams $LB_{1P}$, $LB_{2P}$. In the equation (6), M is a projecting magnification of the projection lens PL.

$$P_R = \frac{\lambda}{2 \cdot \sin\theta_R} = \frac{\lambda}{2M \cdot \sin\theta_W} = \frac{P_W}{2M} \quad (6)$$

Accordingly, the 1st order diffracted ray $RL_1$ (frequency $f_1$) produced by the reticle mark $RM_1$ and the 1st order diffracted ray $RL_2$ (frequency $f_2$) produced by the reticle mark $RM_2$ are returned up to the NBS 16 via the dichroic mirror 5, the object lens 22, the mirror 21, the NBS 19 and the lens 17, while propagating exactly coaxially with the principal rays of the beams $LB_{1P}$, $LB_{2P}$. At the NBS 16, those diffracted rays are reflected thereby to enter a second measurement signal generator 18 (FIG. 1) comprising a mirror 47, a transmission type reference grating plate 48 (a third diffraction grating of the present invention), a spatial filter 49 and a photoelectric detector 50. Since the reference grating plate 48 is disposed in a focal plane of the lens 17 on the downstream side (i.e., plane conjugate to the wafer), the 1st order diffracted rays $RL_1$, $RL_2$ enter the reference grating plate 48 via the mirror 47 in parallel beams from two different directions to be focused (crossed) thereon at a predetermined cross angle. Consequently, a one-dimensional interference fringe is produced on the reference grating plate 48 to flow in the pitch direction of the grating depending on the frequency difference $\Delta f$.

For simplicity of explanation, in this embodiment, the magnification resulted between the focal plane 25 and the reference grating plate 48 is set to 1 (one time), and the grating pitch $P_{GR}$ of the reference grating plate 48 is set to meet $P_{GR}=2P_R$. The 0th order ray Lo produced by the wafer mark $WM_1$ can be also returned exactly coaxially with the principal rays of the beams $LB_{1P}$, $LB_{2P}$ to irradiate the reference grating plate 48 from two different directions along with the 1st order diffracted rays $RL_1$, $RL_2$. However, since the 0th order ray Lo reflected by the wafer mark $WM_1$ on the wafer surface and the 1st order diffracted rays $RL_1$, $RL_2$ (interference fringe) are spatially separated in an image plane on the surface of the reference grating plate 48 (i.e., plane conjugate to the wafer), it is only required to arrange the reference grating plate 48 in the plane conjugate to the wafer depending on the size and position of the interference fringe produced by the 1st order diffracted rays $RL_1$, $RL_2$.

As a result, when the 1st order diffracted rays $RL_1$, $RL_2$ enter the reference grating plate 48, $\pm$1st order diffracted rays are coaxially produced from the reference grating plate 48 and resulting interference light $BTL_R$ (parallel beam) is received by the photoelectric detector 50 via the spatial filter. A 0th order ray Lo' from the reference grating plate 48 is cut off by the spatial filter 49. The photoelectric detector 50 produces a photoelectric signal corresponding to the interference light $BTL_R$, which is outputted to the phase detection system 27 in the form of a sinusoidal alternating current signal depending on the period of light and dark stripes changing in the interference fringe (i.e., a light beat signal of beat frequency) $SD_R$.

As shown in FIG. 1, the phase detection system 27 detects phase differences between the light beat signal SR produced by the reference signal generator 13 as a reference signal and each of the light beat signals $SD_W$, $SD_R$ produced by the first and second measurement signal generators 20, 18, determines a relative phase difference between the two light beat signals $SD_W$ and $SD_R$, and further outputs resulting phase difference information to a main control system 28. Based on phase difference information from the phase detection system 27, the main control system 28 calculates a shift in relative position between the reticle mark $RM_1$ and the wafer mark $WM_1$ with high precision within $\pm P_W/4$ of the grating pitch $P_W$. Also, the main control system 28 generally controls a servo system 26 for interfacing both the interference systems, drive motors 6, 8 and the phase detection system 27.

Meanwhile, the mirror 21 and the object lens 22 of the alignment system in FIG. 1 are fixed together in a metal holder 24 movable by a drive control system 23 to the left and right as indicated by arrow A. Moving the holder 24 enables an observing position of the object lens 22 to be freely changed on the reticle R at least along a radial line passing through the center RC thereof. With the observing position of the object lens 22 moved, the interference light $BTL_W$ and the 0th order ray Lo from the wafer mark $WM_1$ may not be separated and thus partially overlap with each other on the light receiving surface of the photoelectric detector 56 due to defocusing, by way of example. In this embodiment, therefore, the movement stroke of the object lens 22 (holder 24) is set so that the 0th order ray will not mix with the interference light $BTL_W$. The optimum conditions are that when the holder 24 is positioned at the center of the movement stroke for observation, the pupil plane Ep" of the object lens 22 takes a beam waist position, namely, meets conjugate relation with respect to the spatial filter 53. It is then only required to set the interference light $BTL_W$ such that its beam waist passes through just the center of an opening of the spatial filter 53 under the above condition.

Next, operation of the aligning device with this embodiment will be described briefly. In the stepper shown in FIG. 1, the reticle R is first positioned by the recticle alignment system 29 with predetermined accuracy relative to the stepper, and then attracted to the reticle stage RS under vacuum. The holder 24 (mirror 21, object lens 22) is moved by the drive control system 23 in the direction of arrow A depending on the position of the transparent window RW on the reticle R until the optical axis AXa of the object lens 22 almost comes to the center of the transparent window RW, thereby adjusting the observing position of the alignment system. As a next step of alignment between the reticle R and the shot area SA, the wafer stage WS is first stepped to make the shot center SC and the reticle center RC substantially coincident with each other. At this time, supposing that global alignment of the wafer W is correctly carried out by a wafer microscope (not shown) using the off-axis technique, a position shift between both the centers SC and RC is less than ±1 μm on the wafer W. Accordingly, the four marks WM$_1$–WM$_4$ on the wafer W are brought into such positions as allowing them to be observed through the windows RS$_1$–RS$_4$ of the reticle R, respectively. In other words, each wafer mark WM can be positioned to be always held within ±P$_W$/4 for the beams LB$_{1P}$, LB$_{2P}$.

Afterward, alignment between the reticle R (transparent window RW$_1$) and the wafer W (wafer mark WM$_1$) is carried out using the alignment system. When the beams LB$_{1P}$, LB$_{2P}$ are irradiated to the transparent window RW$_1$, the 1st order diffracted rays RL$_1$, RL$_2$ produced by the reticle marks RM$_1$, RM$_2$ enter the reference grating plate 48, whereupon the photoelectric detector 50 receives the interference light BTL$_R$ from the reference grating plate 48 to output the light beat signal SD$_R$ to the phase detection system 27. Then, the phase detection system 27 determines and stores a phase difference Φ$_R$ between the light beat signal SD$_R$ and the light beat signal SR as a reference signal from the photoelectric detector 46. At this time, a shift amount X$_R$ of the reticle R is calculated from the following equation.

$$X_R = \frac{P_R}{2} = \frac{\Phi_R}{2\pi} \qquad (7)$$

On the other hand, the beams LB$_{1P}$, LB$_{2P}$ having passed through the transparent window RW$_1$ (transparent section RS$_{1P}$) are irradiated to the wafer mark WM$_{1P}$, and only the interference light BTL$_W$ from the wafer mark WM$_1$ is extracted and received by the photoelectric detector 56 which outputs the resulting light beat signal SD$_W$ to the phase detection system 27. The phase detection system 27 determines and stores a phase difference Φ$_W$ between the light beat signal SD$_W$ and the light beat signal SR for reference. At this time, a shift amount X$_W$ of the wafer W is calculated from the following equation.

$$X_W = \frac{P_W}{2} = \frac{\Phi_W}{2\pi} \qquad (8)$$

Then, the phase detection system 27 outputs the phase differences Φ$_R$, Φ$_W$ thus determined to the main control system 28. Based on those phase difference information, the main control system 28 calculates a shift amount ΔX in relative position between the reticle R and the wafer W as follows. In the equation (9), M$_{AL}$ is a projecting magnification of the projection lens PL under the alignment wavelength and the shift amount ΔX is a value as measured on the wafer W.

$$\begin{aligned}\Delta X &= X_W - M_{AL} \cdot X_R \\ &= \frac{\lambda \cdot M_{AL}}{4\pi\theta_R}\left(\Phi_W - \frac{\Phi_R}{2}\right)\end{aligned} \qquad (9)$$

Then, the main control system 28 finely moves the reticle stage RS or the wafer stage WS using the serve system 26 so that the aforesaid shift amount ΔX becomes a certain value or zero to make the projection image of the pattern area PA on the reticle R and the shot area SA precisely coincident with each other. In this embodiment, therefore, even if the alignment system is entirely inclined upon the movement of the holder 24, any alignment error will not be caused and the alignment can be achieved with very high precision. In this connection, at the time the shift amount ΔX comes into within a predetermined allowable range (for example, ±0.06 μm), the exposure light IL is irradiated to the irradiated area IA via the illumination optical system 2. In the above alignment, instead of using the servo system 26, the reticle stage RS or the wafer stage WS may be servo controlled so that the relative phase difference between the two light beat signals determined by the phase detection system 27 becomes zero.

Because the dichroic mirror 5 is employed in this embodiment, the shift amount ΔX between the transparent window RW$_1$ and the wafer mark WM$_1$ can be detected at all times even during the exposure operation. It is thus possible to make feedback control of the reticle stage RS or the wafer stage WS in such a manner as to keep the shift amount ΔX within an allowable range, with an advantage of eliminating any image blur caused by possible unsatisfactory vibrations during the exposure operation. Further, by setting the pitch of the interference fringe produced by the 1st diffracted rays RL$_1$, RL$_2$ and the grating pitch of the reference grating plate 48 equal to each other in the second measurement signal generator 18, the light beat signal SD$_R$ may be obtained in a like manner to the reference signal generator 13.

Figure 7:
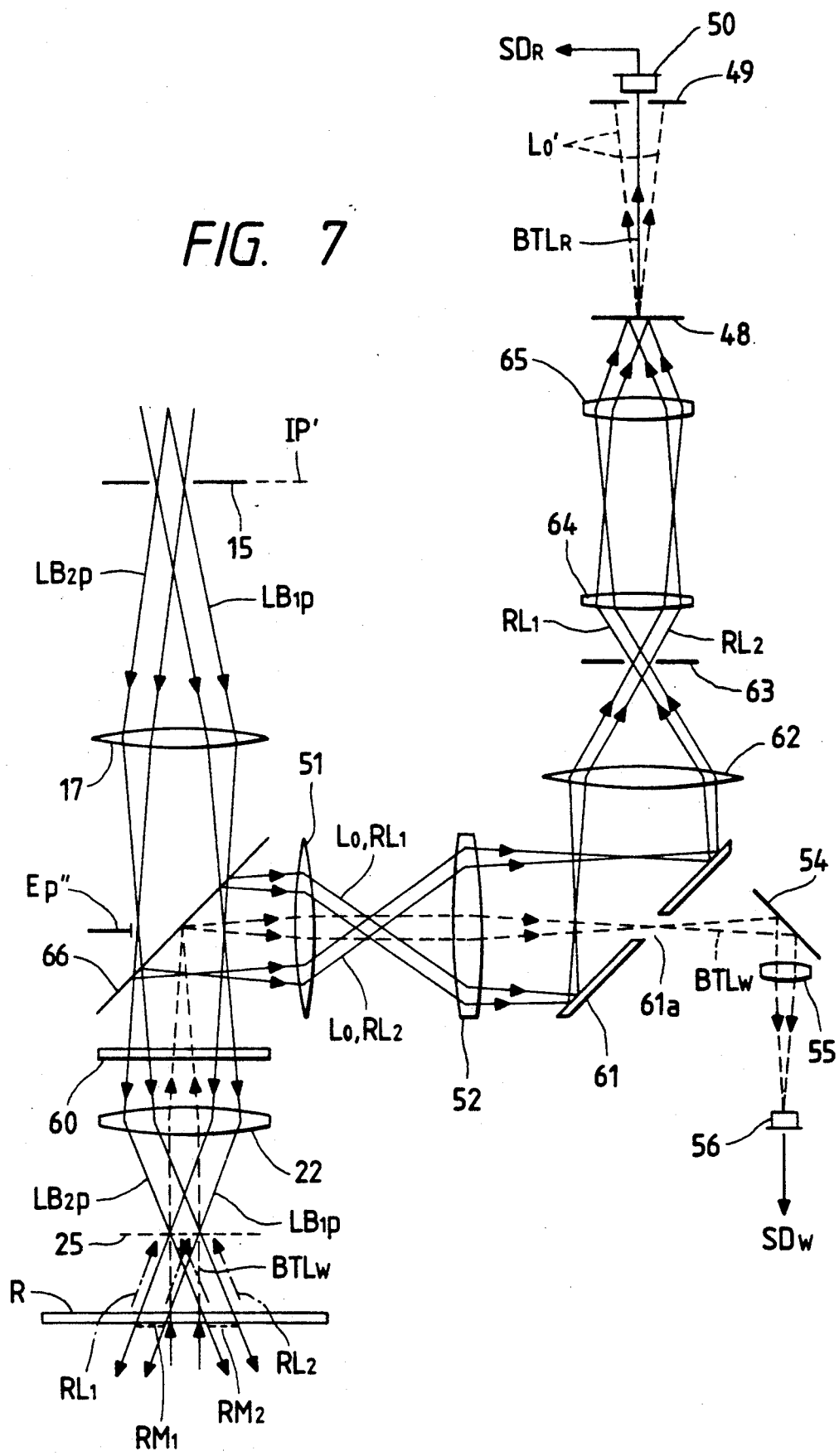
FIG. 7 is a view for explaining a modification of primary part of the alignment system according to the first embodiment.

A modification of the alignment system of this embodiment will be described with reference to FIG. 7. FIG. 7 shows only primary part of the alignment system in detail, in which components functioning and operating in the same manner as those in the above embodiment (FIG. 6) are denoted by the same reference characters. Note that the light transmitting system from the laser beam source 10 to the lens 17 has the exactly same configuration as the above embodiment and will not be thus explained here. In FIG. 7, the p-polarized beams LB$_{1P}$, LB$_{2P}$ passe through the field diaphragm 15, the lens 17 and a polarized beam splitter (PBS) 66 in almost 100% of the light intensity thereof, followed by entering the object lens 22 via a ¼ wavelength plate 60. The two beams LB$_{1P}$, LB$_{2P}$ having been converted into circularly polarized lights by the ¼ wavelength plate 60 are once crossed in the focal plane 25 and, thereafter, are irradiated to the reticle marks RM$_1$, RM$_2$ and also in their parts to the wafer mark WM$_1$ via the transparent section RS$_1$ and the projection lens PL.

The interference light BTL$_W$ produced by the wafer mark WM$_1$ and the 1st order diffracted rays RL$_1$, RL$_{2P}$ respectively produced by the reticle marks RM$_1$, RM$_2$ (BTL$_W$, RL$_1$, RL$_2$ being all circularly polarized) reach via the object lens 22 the ¼ wavelength plate 60 for conversion into s-polarized lights, following which they are reflected by the PBS 66 in almost 100% of the light intensity thereof to reach a spatial filter 61 the afocal magnifying system 51, 52. The spatial filter 61 (strictly speaking, an opening 61a) is arranged substantially in conjugate relation to the entrance pupil Ep to extract only the interference light BTL$_W$ which is then received by the photoelectric detector 56 via the mirror 54 and the condenser lens 55.

Meanwhile, of the reflected lights from the wafer mark WM$_1$ returning exactly coaxially with the principal rays of the beams LB$_{1P}$, LB$_{2P}$, the 0th order ray Lo and the 1st order diffracted rays RL$_1$, RL$_2$ from the reticle marks $RM_1$, $RM_2$ are all reflected by the spatial filter 61 to enter a field diaphragm 63 via a lens 62. The field diaphragm 63 is disposed in a focal plane of the lens 62 on the downstream side (i.e., plane conjugate to the wafer), and has an opening defined depending on the size and position of the 1st order diffracted rays $RL_1$, $RL_{2P}$ (interference fringe) so as to extract only those 1st order diffracted rays $RL_1$, $RL_{2P}$. Then, the 1st order diffracted rays $RL_1$, $RL_{2P}$ are converted by a relay system 64, 65 into parallel beams and irradiated to the reference grating plate 48. The photoelectric detector 50 receives only the interference light $BTL_R$ from the reference grating plate 48 via the spatial filter 49. The aligning device thus arranged has an advantage of reducing loss in the light intensity of the beams $LB_{1P}$, $LB_{2P}$ owing to use of the PBS 66 and the ¼ wavelength plate 60. Further, although the field diaphragm 63 and the relay system 64, 65 are provided to extract only the 1st order diffracted rays $RL_1$, $RL_{2P}$, the reference grating plate 48 may be directly arranged in the position of the field diaphragm 63 (i.e., plane conjugate to the wafer). In this case, the light receiving system can be compacted.

Figure 8:
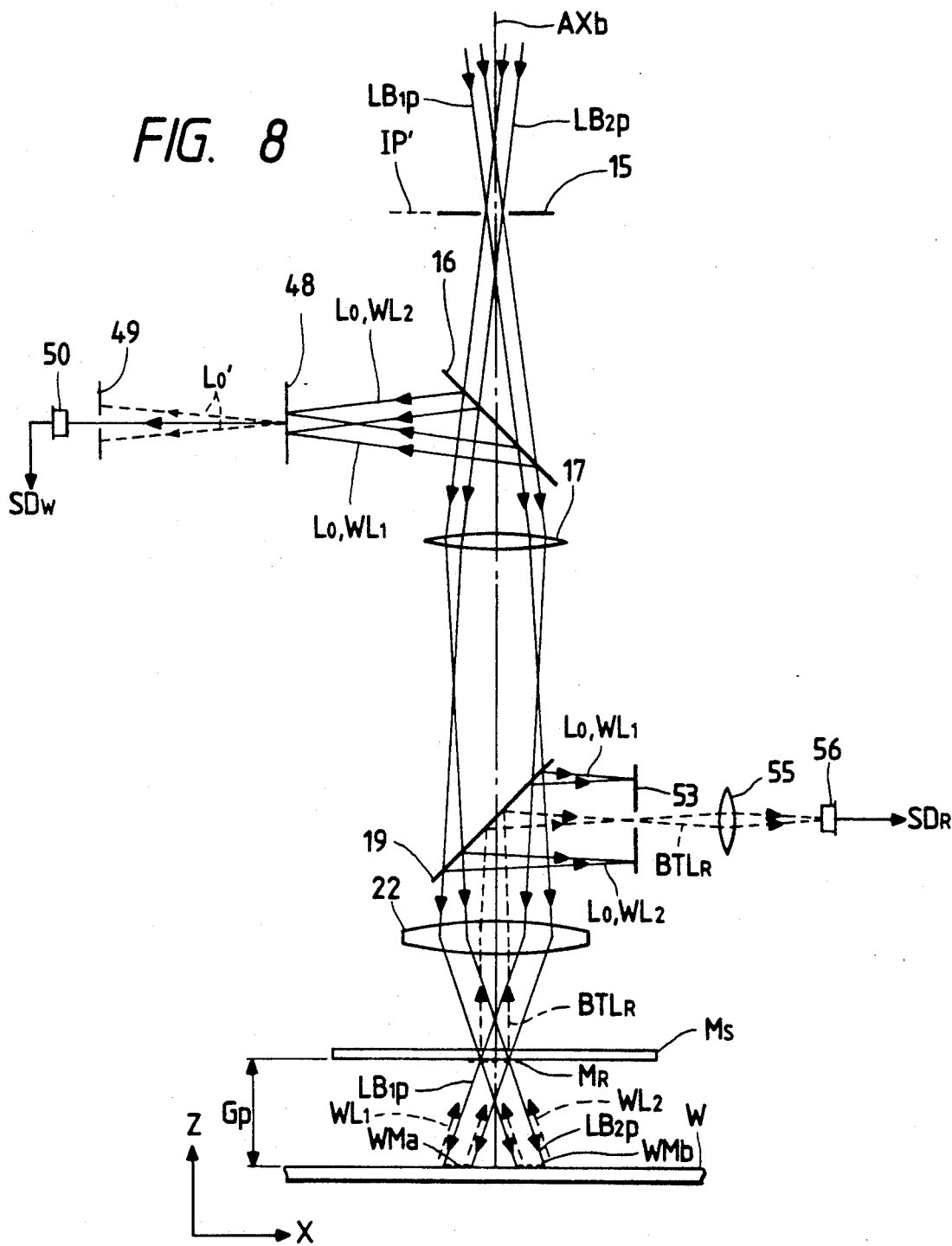
FIG. 8 is a view for explaining primary part of the alignment system, in detail, according to a second embodiment of the present invention suitable for a proximity type exposure apparatus.
Figure 9:
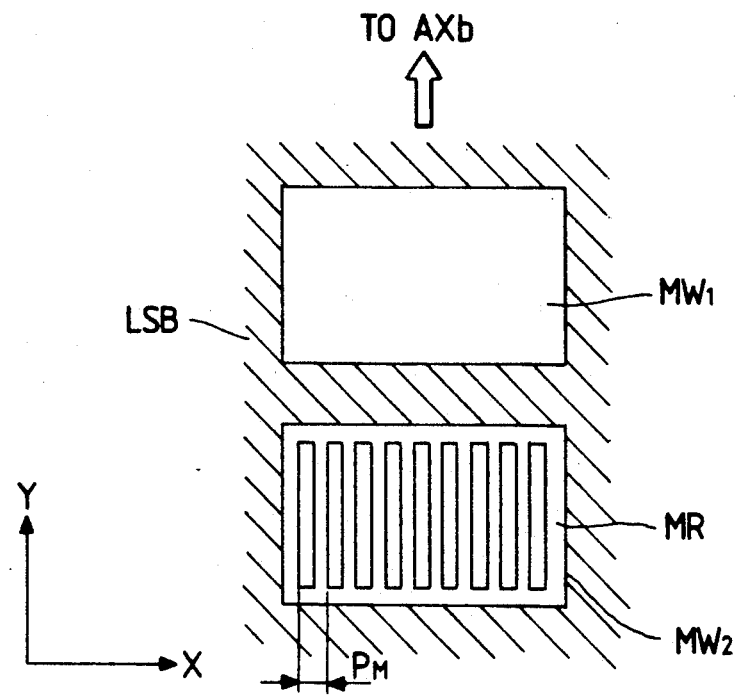
FIG. 9 is a view for showing the detailed configuration of a transparent window formed in a mask for alignment.
Figure 10:
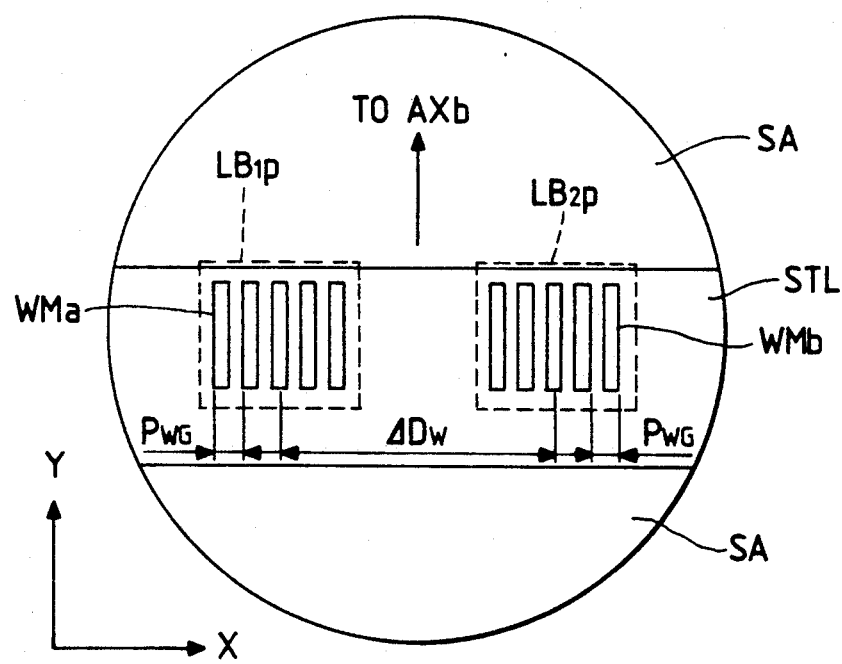
FIG. 10 is a view for explaining the state of marks formed in the photosensitive substrate for alignment.
Figure 11:
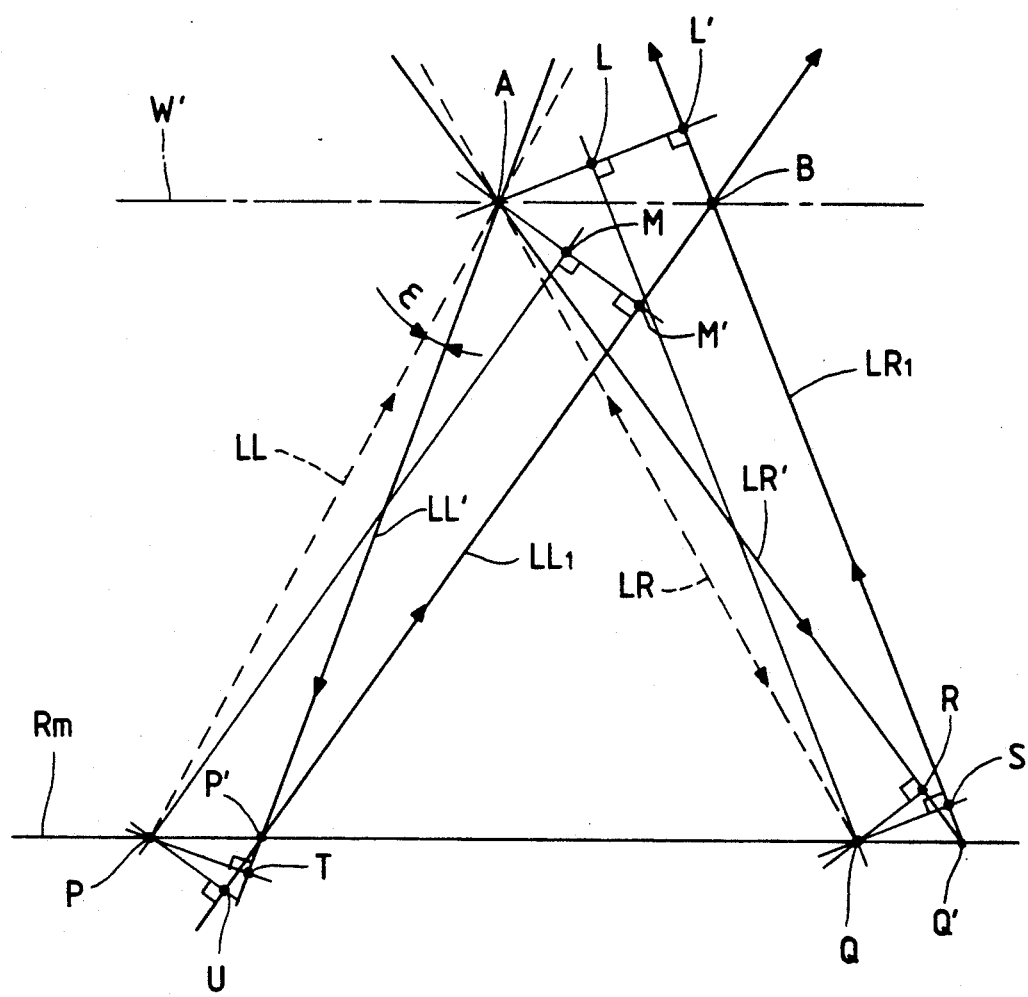
FIG. 11 is a view for explaining the principles of the present invention.
Figure 14:
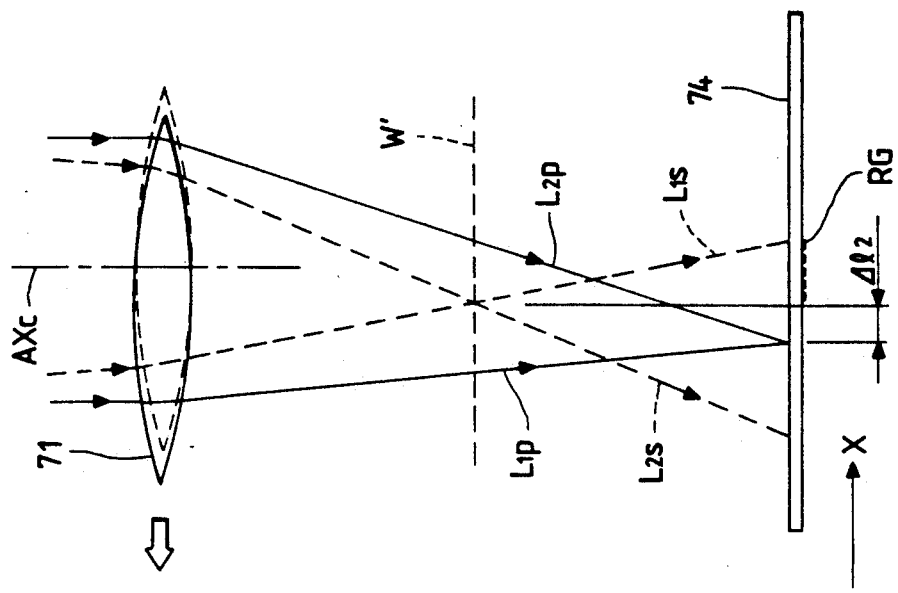
FIGS. 13 and 14 are views for explaining problems in a conventional aligning device.
Figure 13:
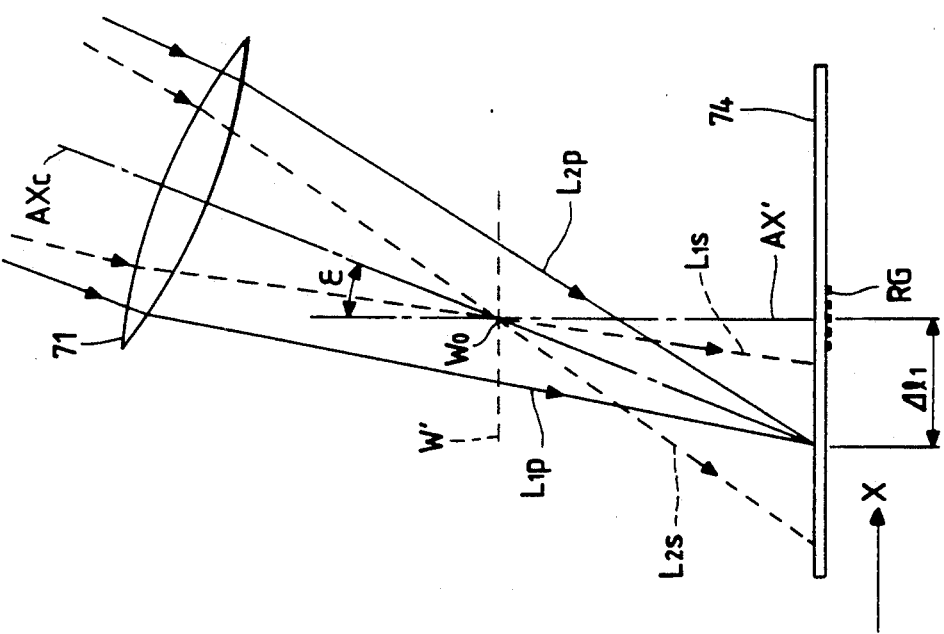

Next, a second embodiment of the present invention will be described with reference to FIGS. 8-10. In this embodiment, the present invention is applied to an alignment system suitable for a proximity type exposure apparatus (e.g., an X-ray exposure apparatus). FIG. 8 shows the detailed configuration of primary part of the alignment system according to this embodiment. An exposure beam from a radiation source (not shown) is irradiated to a mask Ms so that a mask pattern is transferred onto a wafer W spaced from the mask Ms by a predetermined spacing (proximity gap) Gp. The gap Gp corresponds to the amount $\Delta L$ of on-axis chromatic aberration under the wavelength of the beam LB. The alignment system shown in FIG. 8 is of the same configuration as the first embodiment (except omission of the afocal magnifying relay system 51, 52). In FIG. 8, the mask the mask Ms is arranged in the focal plane 25 shown in FIG. 6. Accordingly, in this embodiment, the two beams $LB_{1P}$, $LB_{2P}$ are crossed (focused) in an underside (pattern surface) of the mask Ms and irradiated onto the wafer W at spaced points. But, since the reticle mark (first diffraction grating) and the wafer mark (second diffraction grating) are just interchanged in their functions, the second embodiment essentially operates similarly to the above first embodiment. While the proximity gap Gp depends on the type of light source, the irradiation system of exposure energy and other factors of the exposure apparatus, it is generally determined to be in a range of 10-500 μm.

In FIG. 8, the two beams $LB_{1P}$, $LB_{2P}$ are focused (crossed) by the object lens 22 to impinge upon a grating mark MR from two different directions at a cross angle $2\theta_M$. In a light shielding band LSB of the mask Ms, as shown in FIG. 9, there are defined a transparent section $MW_1$ and an area (transparent section) $MW_2$ in which the grating mark MR of pitch $P_M$ is formed. Parts of the beams $LB_{1P}$, $LB_{2P}$ irradiated to the mask Ms pass through the transparent section $MW_1$, following which they are spaced on the wafer W to respectively irradiate grating marks WMa, WMb (each of grating pitch $P_{WG}$). The grating marks WMa, WMb are formed in a street line STL with a spacing $\Delta D_W$ therebetween. The pitch $P_M$ of the grating mark MR, the pitch $P_{WG}$ of the grating marks WMa, WMb, and the spacing $\Delta D_W$ are determined as follows:

$$P_M = \frac{\lambda}{\theta_M} \tag{10}$$

$$P_{WG} = \frac{\lambda}{2 \cdot \sin\theta_M} \tag{11}$$

$$\Delta D_W = 2Gp \cdot \tan\theta_M \tag{12}$$

As a result, ±1st order diffracted rays from the wafer mark MR are coaxially synthesized into a light beat (interference light) $BTL_R$ which propagates reversely along the optical axis AXb to reach a pupil position or the spatial filter 53 in a plane conjugate to the pupil position via the object lens NBS 19. The spatial filter 53 extracts only the $BTL_R$ and the photoelectric detector 56 outputs a light beat signal $SD_R$ with beat frequency of the frequency difference $\Delta f$ corresponding to the interference light $BTL_R$.

Meanwhile, 1st order diffracted rays $WL_1$, $WL_2$ from the grating marks WMa, WMb are returned up to the NBS 16 via the object lens 22, the NBS 19 and the lens 17, while propagating exactly coaxially with the principal rays of the beams $LB_{1P}$, $LB_{2P}$. At the NBS 16, the 1st order diffracted rays $WL_1$, $WL_2$ are reflected thereby to irradiate the reference grating plate 48 from two different directions. The reference grating plate 48 is arranged in the focal plane of the lens 17 on the downstream side, depending on the size and position of with the 1st order diffracted rays $WL_1$, $WL_2$ (interference fringe), substantially in conjugate relation to the mask Ms. Accordingly, only the 1st order diffracted rays $WL_1$, $WL_2$ are allowed to irradiate the reference grating plate 48, so that the photoelectric detector 50 receives only the interference light $BTL_W$ from the reference grating plate 48 via the spatial filter 49 and outputs a light beat signal $SD_W$ with beat frequency of the frequency difference $\Delta f$ corresponding to the interference light $BTL_W$.

The phase detection system 27 determines and stores phase differences $\Phi_R'$, $\Phi_W'$ between the light beat signal SR for reference and each of the light beat signals $SD_R$, $SD_W$. In this connection, a shift amount $\Delta X_R'$ of the mask Ms and a shift amount $\Delta X_W'$ of the wafer W can be determined from equations respectively equivalent to the equations (7), (8) shown before in connection with the first embodiment. Based on the phase difference information ($\Phi_R'$, $\Phi_W'$) from the phase detection system 27, the main control system 28 calculates a shift amount $\Delta X'$ in relative position between the mask Ms and the wafer W as follows.

$$\Delta X' = X_W' - X_R' \tag{13}$$
$$= \frac{\lambda}{4\pi\theta_M} \left( \frac{\Phi_W'}{2} - \Phi_R' \right)$$

Then, the mask Ms and the wafer W are finely moved relative to each other so that the aforesaid shift amount $\Delta X'$ becomes a certain value or zero to make the projection image of the pattern area PA on the reticle R and the shot area SA precisely coincident with each other. Even in the proximity type exposure apparatus, therefore, any alignment error due to an inclination of the alignment system will not be caused and the alignment can be achieved with very high precision.

While the two beams $LB_{1P}$, $LB_{2P}$ are crossed (focused) on the wafer W in the first embodiment of the present invention and are crossed on the mask Ms (reticle) in the second embodiment as mentioned above, it is also possible that the beams $LB_{1P}$, $LB_{2P}$ are irradiated to cross on the reticle R and separate on the wafer W in the first embodiment, and are irradiated to separate on the mask Ms and cross on the wafer W in the second embodiment. Also, while the grating pitch $P_R$ is set to make the 1st order diffracted rays $RL_1$, $RL_2$ return coaxially with the principal rays of the beams $LB_{1P}$, $LB_{2P}$, any other rays than the 1st order diffracted rays may be instead used so long as they are diffracted rays returning coaxially with the principal rays of the beams $LB_{1P}$, $LB_{2P}$. For example, if the grating pitch $P_R$ of the reticle marks $RM_1$, $RM_2$ is set to a value twice the value derived from the above equation (6), i.e., if the duty ratio of the reticle marks $RM_1$, $RM_2$ is changed to meet $P_R = \lambda/\sin\theta_R$, 2nd order diffracted rays are produced coaxially with the principal rays of the beams $LB_{1P}$, $LB_{2P}$ and, therefore, these 2nd order diffracted rays may be used to obtain the light beat signal $SD_R$. It is needless to say that other rays than the 1st order diffracted rays may be likewise instead used in the second embodiment, too. The essential is that the diffracted rays of predetermined order are crossed in the focal plane 25 (i.e., plane conjugate to the wafer) in the first embodiment and in the pattern surface of the reticle R in the second embodiment.

It is also needless to say that the present invention is applicable to alignment systems of not only heterodyne type, but also homodyne type or other type that polarized components of two beams are made different not to produce an interference infringe on a grating mark, and p- and s-polarized beams returning from the grating mark are converted by an analyzer (double-refractive plate) into interference light for subsequent photoelectric detection.

Further, while the same beams $LB_{1P}$, $LB_{2P}$ are irradiated to both the reticle R and the wafer W in the first embodiment, two beams to be irradiated to the reticle R and the wafer W may be different from each other. If the reference grating plate 48 (third diffraction grating) is provided for each of the reticle R and the wafer W independently, the cross angles $2\theta_R$, $2\theta_W$ of two beams in pair entering each of the reticle R and the wafer W can be set independently from each other. In this case, however, it is also required that the diffracted rays from the reticle marks $RM_1$, $RM_2$ of the two beams entering the reticle R are set to cross in the focal plane 25, and the grating pitch $P_R$ of the reticle marks $RM_1$, $RM_2$ is set to return the diffracted rays coaxially with the principal rays of the two beams, respectively. Setting the cross angles $2\theta_R$, $2\theta_W$ of two beams in pair entering each of the reticle R and the wafer W independently, as stated above, is particularly effective in the case of the projection lens PL having magnification chromatic aberration. More specifically, when the position of the alignment system (holder 24) is changed corresponding to position change of the transparent window RW of the reticle R, the magnification of the two beams irradiated to the wafer W is changed and, therefore, the cross angle $2\theta_W$ of the two beams must be also changed depending on such a change in the magnification. If the cross angles $2\theta_R$, $2\theta_W$ of two beams in pair entering each of the reticle R and the wafer W are set independently, the cross angle $2\theta_R$ on the reticle can be held constant while changing the cross angle $2\theta_W$ on the wafer W.

According to the present invention, even when a mask and a plane conjugate to a photosensitive substrate (or a plane conjugate to a mask and a photosensitive substrate) are spaced from each other due to chromatic aberration of a projection optical system, or a gap is present between the mask and the photosensitive substrate like a proximity type exposure apparatus, a possible alignment error caused by an inclination of the alignment system (that is, two beams for alignment) due to vibrations or the like can be suppressed to minimum (substantially zero), thereby achieving the TTR type alignment with high accuracy.

What is claimed is:

1. An alignment device for an exposure apparatus, said alignment device being provided in an apparatus, which uses illumination light in a predetermined range of wavelengths to project and focus an image of a pattern formed on a mask onto a photosensitive substrate through a projection optical system, for optically detecting light from a first diffraction grating formed on said mask and a second diffraction grating formed on said photosensitive substrate to thereby align said mask and said photosensitive substrate with each other, comprising:

irradiation means having an object optical system for radiating two coherent beams, having a different range of wavelengths from said illumination light, to said first and second diffraction gratings via said object optical system in such a manner that the beams cross each other at a predetermined angle on one of said first and second diffraction gratings;

first light receiving means for photoelectrically detecting interference light of diffracted rays produced substantially in the same direction from said one diffraction grating;

a third diffraction grating disposed in a plane substantially conjugate to said one diffraction grating;

second light receiving means for photoelectrically detecting interference light of diffracted rays produced by said third diffraction grating from diffracted rays of said two beams which are diffracted by the other of said first and second diffraction gratings and which impinge upon said third diffraction grating at a predetermined incident angle via said object optical system;

detection means for comparing respective signals from said first and second light receiving means to output a detection signal depending on a shift in relative position between said mask and said photosensitive substrate; and movement means for changing the relative position between said mask and said photosensitive substrate based on said detection signal.

2. An aligning device according to claim 1, wherein said irradiation means is arranged to cause said two beams to cross on said second diffraction grating, and a grating pitch $P_R$ of said first diffraction grating is given by:

$$P_R = \frac{N \cdot \lambda}{2 \cdot \sin\theta_R}$$

where an angle at which said two beams cross on said mask is $2\theta_R$, a wavelength of said two beams is $\lambda$, and the order of the diffracted rays produced by said first diffraction grating is N.

3. An alignment device to be provided in an apparatus, in which a pattern formed on a mask is exposed onto a photosensitive substrate disposed in opposite relation to said mask with a predetermined spacing therebetween, for optically detecting light from a first diffraction grating formed on said mask and a second diffraction grating formed on said photosensitive substrate to thereby align said mask and said photosensitive substrate with each other, comprising:

irradiation means having an object optical system for radiating two coherent beams, having a predetermined wavelength, to said first and second diffraction gratings via said object optical system in such a manner that the beams cross each other at a predetermined angle on one of said first and second diffraction gratings;

first light receiving means for photoelectrically detecting interference light of diffracted rays produced substantially in the same direction from said one diffraction grating;

a third diffraction grating disposed in a plane substantially conjugate to said one diffraction grating;

second light receiving means for photoelectrically detecting interference light of diffracted rays produced by said third diffraction grating from diffracted rays of said two beams which are diffracted by the other of said first and second diffraction gratings and which impinge upon said third diffraction grating at a predetermined incident angle via said object optical system;

detection means for comparing respective signals from said first and second light receiving means to output a detection signal depending on a shift in relative position between said mask and said photosensitive substrate; and movement means for changing the relative position between said mask and said photosensitive substrate based on said detection signal.

4. An alignment device for an exposure apparatus which is provided with an illumination optical system for irradiating a pattern formed on a mask with illuminating light in a predetermined range of wavelengths and a projection optical system for projecting and focusing an image of the pattern formed on the mask onto a photosensitive substrate, the device aligning said mask and said photosensitive substrate with each other on the basis of a first light-diffracting mark formed on said mask and a second light-diffracting mark formed on said photosensitive substrate, the device comprising:

irradiation means for radiating two beams having a different range of wavelengths from said illuminating light onto said first mark and said second mark in such a manner that the two beams cross each other at a predetermined angle on one of said first and second marks;

first light receiving means for photoelectrically detecting interference light of diffracted rays generated from said one of said first and second marks and diffracted in substantially the same direction;

a third light-diffracting mark disposed in a plane substantially conjugate to said one of said first and second marks;

second light receiving means for guiding diffracted rays of said two beams produced from the other of said first and second marks in such a way that the diffracted rays of said two beams impinge upon said third mark at a predetermined incident angle and photoelectrically detecting interference light of diffracted rays generated from said third mark; and detection means for detecting relative positional displacement between said mask and said photosensitive substrate on the basis of signals from said first and second light receiving means.

5. An alignment device according to claim 4 wherein said first mark has a diffraction grating pitch in a predetermined direction and said mask has a transparent portion adjacent to said first mark in a direction perpendicular to said grating pitch direction for transmitting said two beams so as to irradiate said second mark.

6. An alignment device according to claim 5 wherein said irradiation means radiates said two beams separately onto said first mark in such a way that said two beams having passed through said transparent area and said projection optical system cross each other on said second mark at a predetermined angle.

7. An alignment device according to claim 6 wherein said first mark has a grating pitch $P_R$ given by:

$$P_R = \frac{N \cdot \lambda}{2 \cdot \sin\theta_R}$$

where said two beams cross on said mask at an angle $2\theta_R$, a wavelength of said two beams is $\lambda$, and the order of the diffracted rays produced by said first mark is N.

8. An alignment device according to claim 4 wherein said irradiation means comprises a laser source for outputting a beam, a beam splitter for splitting the beam into two beams and a frequency shifter disposed in a light path of at least one of said two beams generated by said beam splitter for producing a predetermined frequency difference between said two beams.

9. An alignment device for an exposure apparatus which is provided with an illumination optical system for irradiating a pattern formed on a mask with an illuminating light in a predetermined range of wavelengths for exposing a photosensitive substrate, which is spaced oppositely from said mask by a predetermined distance, with said pattern on the mask, the device aligning said mask and said photosensitive substrate with each other on the basis of a first light-diffracting mark formed on said mask and a second light-diffracting mark formed on said photosensitive substrate, the device comprising:

irradiation means for radiating two beams having a different range of wavelengths from said illuminating light onto said first mark and said second mark in such a manner that the two beams cross each other at a predetermined angle on one of said first and second marks;

first light receiving means for photoelectrically detecting interference light of diffracted rays generated from said one of said first and second marks in substantially the same direction;

a third light-diffracting mark disposed in a plane substantially conjugate to said one of said first and second marks;

second light receiving means for guiding diffracted rays of said two beams generated from the other of said first and second marks in such a way that the diffracted rays of said two beams impinge upon said third mark at a predetermined incident angle and photoelectrically detecting interference light of diffracted rays generated from said third mark; and detection means for detecting relative positional displacement between said mask and said photosensitive substrate on the basis of signals from said first and second light receiving means.

10. An alignment device for an exposure apparatus which is provided with an illumination optical system for irradiating a pattern formed on a mask with illuminating light in a predetermined range of wavelengths and a projection optical system for projecting and focusing an image of the pattern formed on the mask onto a photosensitive substrate, the device aligning said mask and said photosensitive substrate with each other on the basis of a first mark formed on said mask and a second mark formed on said photosensitive substrate, the device comprising:

irradiation means for radiating two beams having a different range of wavelengths from said illuminating light onto said first mark and said second mark in such a manner that the two beams cross each other at a predetermined angle on one of said first and second marks, the other of said first and second marks being a light-diffracting mark;

first light receiving means for photoelectrically detecting light produced by irradiation of said one of said first and second marks by said two beams;

synthesizing means for causing diffracted light of said two beams generated from the other of said first and second marks to interfere and produce synthesized interference light; and second light receiving means for photoelectrically detecting said synthesized interference light;

wherein relative positional displacement between said mask and said photosensitive substrate is corrected on the basis of signals from said first and second light receiving means.

11. An alignment device according to claim 10 wherein said one of said first and second marks is a light-diffracting mark and said first light receiving means photoelectrically detects interference light of diffracted rays generated from said one of said first and second marks and diffracted in substantially the same direction.

12. An alignment device for an exposure apparatus which is provided with an illumination optical system for irradiating a pattern formed on a mask with illuminating light in a predetermined range of wavelengths and a projection optical system for projecting and focusing an image of the pattern formed on the mask onto a photosensitive substrate, the device aligning said mask and said photosensitive substrate with each other on the basis of a first light-diffracting mark formed on said mask and a second light-diffracting mark formed on said photosensitive substrate, the device comprising:

radiating means for radiating first two beams having a different range of wavelengths from said illuminating light onto said first mark and radiating second two beams having a different range of wavelengths from said illuminating light onto said second mark in such a manner that the beams of one of said first and second two beams cross each other at a predetermined angle on one of said first and second marks;

first light receiving means for photoelectrically detecting interference light of diffracted rays generated from said one of said first and second marks and diffracted in substantially the same direction;

a third light-diffracting mark disposed in a plane substantially conjugate to said one of said first and second marks;

second light receiving means for guiding diffracted rays generated from the other of said first and second marks in such a way that the diffracted rays impinge upon said third mark at a predetermined incident angle and photoelectrically detecting interference light of diffracted rays produced from said third mark; and detection means for detecting relative positional displacement between said mask and said photosensitive substrate on the basis of signals from said first and second light receiving means.

* * * * *